United States Patent
Kim et al.

(10) Patent No.: US 12,156,454 B2
(45) Date of Patent: Nov. 26, 2024

(54) ELECTRONIC DEVICE

(71) Applicant: Samsung Display Co., Ltd., Yongin-si (KR)

(72) Inventors: Moojong Kim, Yongin-si (KR); Kicheol Kim, Yongin-si (KR); Minjoo Kim, Yongin-si (KR); Dongjin Moon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 54 days.

(21) Appl. No.: 18/186,892

(22) Filed: Mar. 20, 2023

(65) Prior Publication Data

US 2023/0337502 A1    Oct. 19, 2023

(30) Foreign Application Priority Data

Apr. 15, 2022    (KR) .................. 10-2022-0046754

(51) Int. Cl.
- *G06F 3/041*    (2006.01)
- *G06F 3/044*    (2006.01)
- *H10K 59/40*    (2023.01)
- *H10K 59/80*    (2023.01)

(52) U.S. Cl.
CPC .......... *H10K 59/40* (2023.02); *G06F 3/0446* (2019.05); *H10K 59/878* (2023.02)

(58) Field of Classification Search
CPC ..... H10K 59/40; H10K 59/878; G06F 3/0446
USPC ....................................................... 345/173
See application file for complete search history.

(56) References Cited

U.S. PATENT DOCUMENTS

| | | | |
|---|---|---|---|
| 10,817,120 B2 | 10/2020 | Park et al. | |
| 2012/0056664 A1* | 3/2012 | Nam | H03K 17/9622 327/517 |
| 2017/0097710 A1* | 4/2017 | Bok | H10K 50/856 |
| 2018/0136760 A1* | 5/2018 | Lee | G06F 3/044 |
| 2020/0026375 A1* | 1/2020 | Park | G06F 3/0448 |
| 2020/0326817 A1* | 10/2020 | Park | G06F 3/047 |
| 2021/0141491 A1 | 5/2021 | Gogte et al. | |

FOREIGN PATENT DOCUMENTS

| | | |
|---|---|---|
| JP | 2018-124670 A | 8/2018 |
| KR | 10-2012-0134955 A | 12/2012 |
| KR | 10-2018-0080761 A | 7/2018 |
| KR | 10-2020-0009167 A | 1/2020 |
| KR | 10-2021-0056914 A | 5/2021 |

\* cited by examiner

*Primary Examiner* — Jonathan M Blancha
(74) *Attorney, Agent, or Firm* — Lewis Roca Rothgerber Christie LLP

(57) ABSTRACT

Provided is an electronic device including a display panel including an active region, and a peripheral region at one side of the active region, and an input sensor including a sensing region above the active region, a sensing peripheral region above the peripheral region, and a line region above the active region and between the sensing region and the sensing peripheral region, wherein the input sensor includes sensing electrodes arranged in the sensing region, main lines arranged in the line region, and connected to the sensing electrodes, and reflection patterns arranged in the line region between the main lines.

24 Claims, 24 Drawing Sheets

ELECTRONIC DEVICE

CROSS-REFERENCE TO RELATED APPLICATION

This application claims priority to, and the benefit of, Korean Patent Application No. 10-2022-0046754, filed on Apr. 15, 2022, in the Korean Intellectual Property Office, the entire contents of which are hereby incorporated by reference.

BACKGROUND

1. Field

The present disclosure herein relates to an electronic device including an input sensor.

2. Description of Related Art

Electronic devices include active regions that are activated in response to electrical signals. Such an electronic device may sense an input applied from the outside through the active region and, at the same time, display various images to provide information to a user. Recently, as electronic devices having various shapes have been developed, active regions having various shapes are being embodied.

In addition, in order to reduce or minimize a peripheral region outside the active region and improve display quality, a technique for improving or optimizing the arrangement of a sensing electrode or a sensing line of an input sensor is being developed.

SUMMARY

The present disclosure provides an electronic device that decreases a degree of visibility of sensing wires arranged in an active region.

One or more embodiments of the present disclosure provide an electronic device including a display panel including an active region, and a peripheral region at one side of the active region, and an input sensor including a sensing region above the active region, a sensing peripheral region above the peripheral region, and a line region above the active region and between the sensing region and the sensing peripheral region, wherein the input sensor includes sensing electrodes arranged in the sensing region, main lines arranged in the line region, and connected to the sensing electrodes, and reflection patterns arranged in the line region between the main lines.

The display panel may include light-emitting regions arranged in the active region, wherein the main lines do not overlap the light-emitting regions, the main lines including a first line extending in a first extension direction, and a second line connected to the first line, and extending in a second extension direction that is different from the first extension direction.

The reflection patterns might not overlap the light-emitting regions, and may include a first reflection pattern extending in a first protrusion direction substantially parallel to the second extension direction, and a second reflection pattern extending in a second protrusion direction substantially parallel to the first extension direction.

The first reflection pattern may be connected to the first line, wherein the second reflection pattern is connected to the second line.

The light-emitting regions may define light-emitting rows extending in a first direction substantially parallel to the first extension direction, and arranged in a second direction substantially perpendicular to the first direction, and light-emitting columns extending in the second direction, and arranged in the first direction.

The main lines may include a first main line and a second main line that are adjacent to each other with an n-th light-emitting row among the light-emitting rows and an m-th light-emitting column therebetween, wherein the first reflection pattern is between ones of the light-emitting regions that are adjacent to each other in the first direction in the n-th light-emitting row, wherein the second reflection pattern is between others of the light-emitting regions that are adjacent to each other in the second direction in the m-th light-emitting column, and wherein each of n and m is an integer of one or more.

The first reflection pattern may include sub-reflection patterns spaced apart from each other in the first extension direction.

At least one of the sub-reflection patterns may be spaced apart from the main lines.

The first reflection pattern may include a first sub-reflection pattern connected to the first main line thereof, and a second sub-reflection pattern connected to the second main line thereof.

The first line of each of the first main line and the second main line may include first sections substantially parallel to the first extension direction, and arranged between the ones of the light-emitting regions in the n-th light-emitting row, and second sections arranged between the first sections, and at least partially surrounding each of the ones of the light-emitting regions, wherein the second line of each of the first main line and the second main line includes third sections substantially parallel to the second extension direction, and arranged between the others of the light-emitting regions in the m-th light-emitting column, and fourth sections arranged between the third sections, and at least partially surrounding each of the others of the light-emitting regions.

A sum of lengths of the sub-reflection patterns between the first main line and the second main line of a unit length in the first protrusion direction may be equal to a sum of lengths of the third sections of the first main line and the second main line of a unit length in the second extension direction.

The first reflection pattern may include a first sub-reflection pattern connected to each of the first sections of the first main line, and a second sub-reflection pattern connected to each of the first sections of the second main line.

A length of the first sub-reflection pattern in the first protrusion direction may be different from a length of the second sub-reflection pattern in the first protrusion direction.

The second reflection pattern may include sub-reflection patterns spaced apart from each other in the second extension direction.

The second reflection pattern may include a third sub-reflection pattern connected to the first main line thereof, and a fourth sub-reflection pattern connected to the second main line thereof.

A sum of lengths of the sub-reflection patterns arranged between the first main line and the second main line in the second protrusion direction may be equal to a sum of lengths of the first sections of the first main line and the second main line in the first extension direction.

The second reflection pattern may include a third sub-reflection pattern connected to each of the third sections of the first main line, and a fourth sub-reflection pattern connected to each of the third sections of the second main line.

Each of the reflection patterns may have an inclined side surface when viewed in a cross-sectional view that is substantially perpendicular to upper surface of the display panel.

In one or more embodiments of the present disclosure, an electronic device includes a display panel including an active region, in which light-emitting regions are arranged, and a peripheral region around the active region, and an input sensor above the display panel, and including sensing electrodes, sensing lines respectively connected to the sensing electrodes, and reflection patterns respectively between adjacent ones of the sensing lines, wherein each of the sensing lines includes a peripheral line above the peripheral region, and a main line above the active region, wherein the main line does not overlap the light-emitting regions, and wherein each of the reflection patterns extends in a direction substantially perpendicular to an extension direction of the main line adjacent thereto.

The main line may include a first line extending in a first extension direction, and a second line connected to the first line and extending in a second extension direction that is different from the first extension direction.

Each of the sensing electrodes may include a sensing pattern that has a mesh shape and does not overlap the light-emitting regions, wherein the main line has a shape corresponding to the mesh shape, and wherein each of the first line and the second line includes first sections arranged between the light-emitting regions and substantially parallel to the extension direction, and second sections connected to the first sections and at least partially surrounding each of the light-emitting regions.

The reflection patterns might not overlap the light-emitting regions, and may include first reflection patterns extending in a first protrusion direction substantially parallel to the second extension direction, and second reflection patterns extending in a second protrusion direction substantially parallel to the first extension direction.

The first reflection patterns may be adjacent to the first sections of the first line, respectively, wherein a sum of lengths of surfaces at one side of the first reflection patterns in the first protrusion direction is equal to a sum of lengths of surfaces at one side of the first sections of the second line in the first protrusion direction.

The second reflection patterns may be adjacent to the first sections of the second line, respectively, wherein a sum of lengths of surfaces at one side of the second reflection patterns in the second protrusion direction is equal to a sum of lengths of surfaces at one side of the first sections of the first line in the second protrusion direction.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain aspects of the present disclosure. In the drawings.

DETAILED DESCRIPTION

Figure 1:
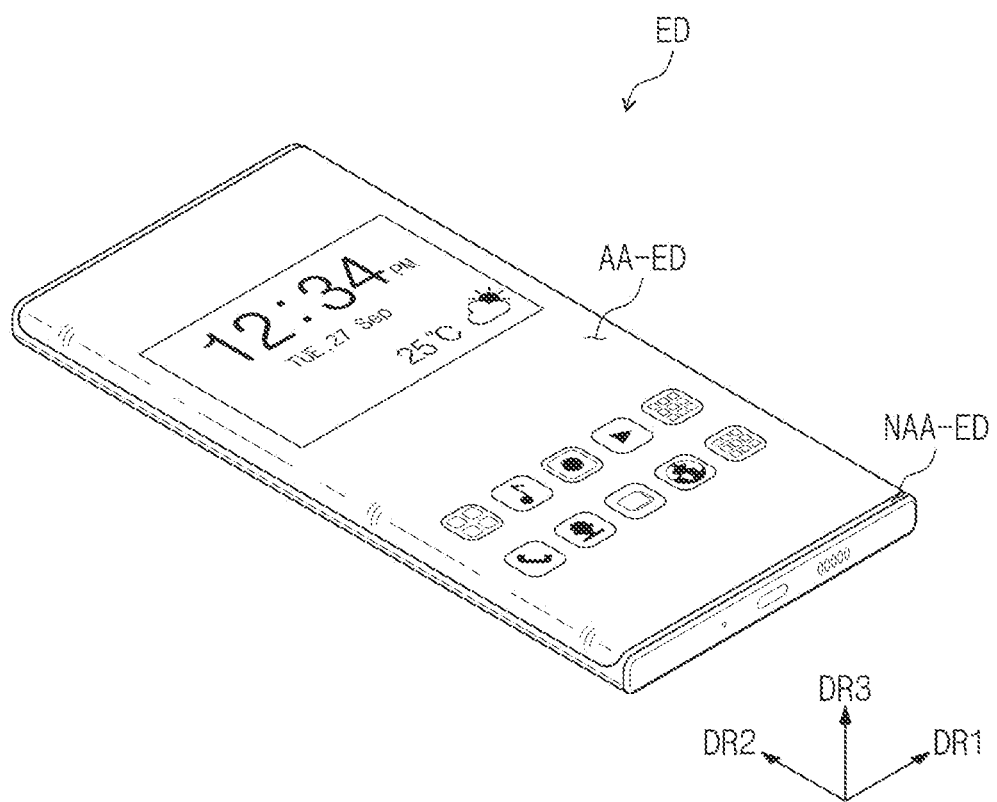
FIG. 1 is a perspective view of an electronic device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, an electronic device according to one or more embodiments of the present disclosure will be described with reference to the drawings.

Figure 2:
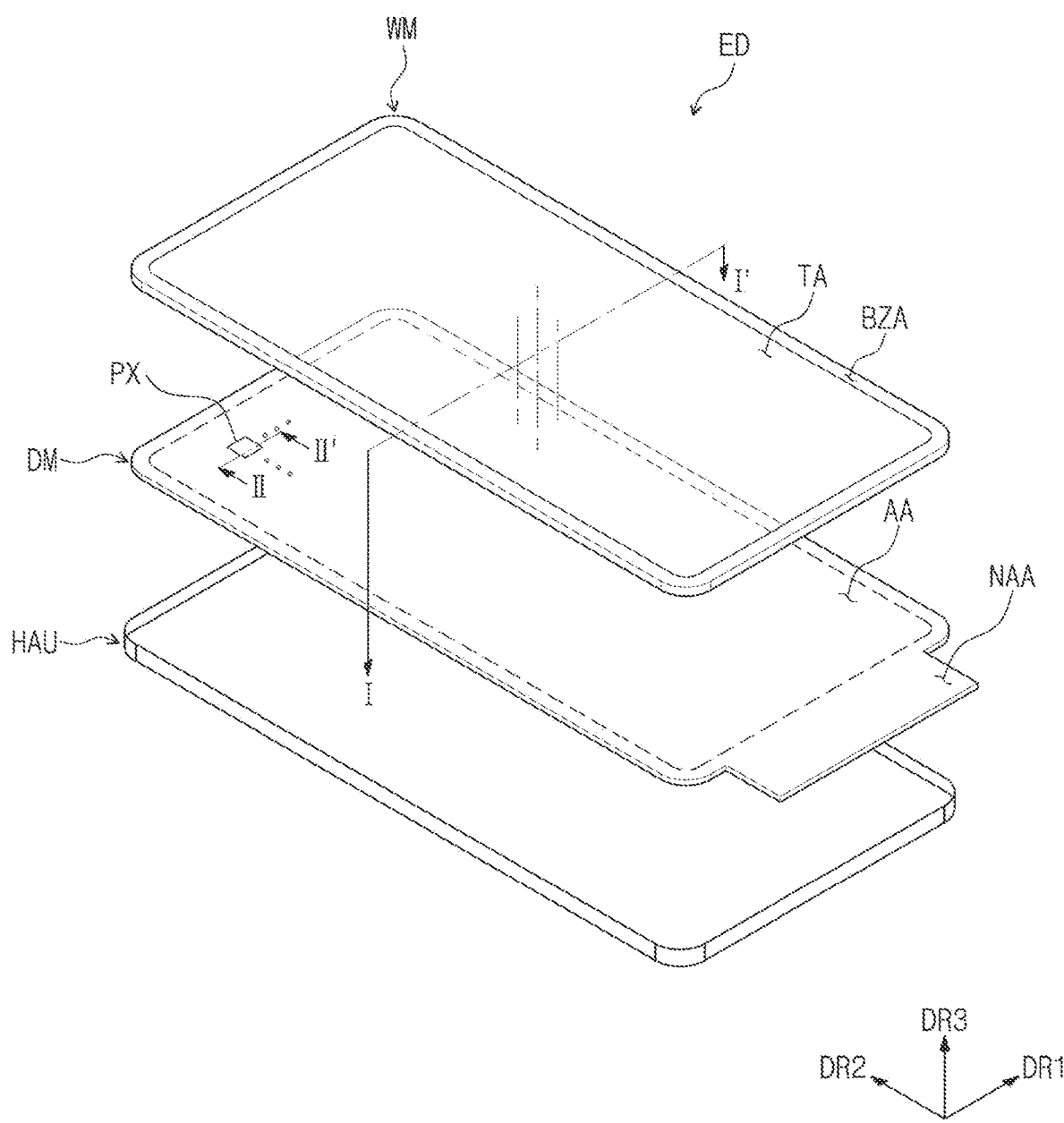
FIG. 2 is an exploded perspective view of an electronic device according to one or more embodiments.
Figure 3:
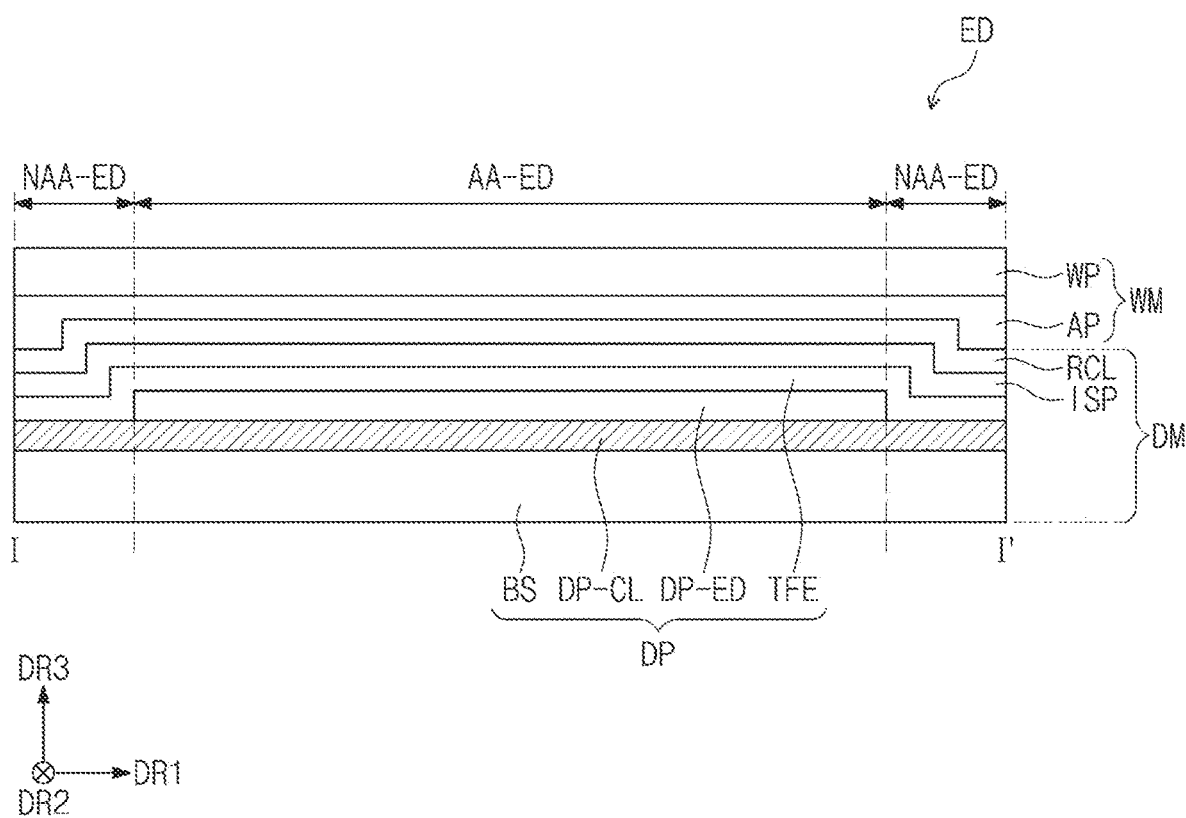
FIG. 3 is a cross-sectional view of an electronic device according to one or more embodiments.

FIG. 1 is a perspective view showing an electronic device according to one or more embodiments. FIG. 2 is an exploded perspective view of an electronic device according to one or more embodiments. FIG. 3 is a cross-sectional view of a display device according to one or more embodiments. FIG. 3 may be a cross-sectional view corresponding to the line I-I' of FIG. 2.

An electronic device ED according to one or more embodiments illustrated in FIGS. 1 to 3 may be a device activated in response to an electrical signal. For example, the electronic device ED may be a mobile phone, a tablet PC, a vehicle navigation unit, a game console, or a wearable device, but one or more embodiments is not limited thereto. FIG. 1 illustrates the electronic device ED as a mobile phone.

The electronic device ED according to one or more embodiments may display an image IM through an active region AA-ED. The active region AA-ED may have a plane defined by a first direction axis DR1 and a second direction axis DR2. The active region AA-ED may further include a curved surface that bends from at least one side of the plane defined by the first direction axis DR1 and the second direction axis DR2. FIG. 1 illustrates that the electronic device ED according to one or more embodiments includes two curved surfaces that are bent from two sides, respectively, of the plane defined by the first direction axis DR1 and the second direction axis DR2. However, the shape of the active region AA-ED is not limited thereto. For example, the active region AA-ED may include only the plane. Also, at least two or more, for example, four sides of the plane may be bent, and thus the active region AA-ED may further include four curved surfaces.

A peripheral region NAA-ED is adjacent to the active region AA-ED. The peripheral region NAA-ED may surround the active region AA-ED. Accordingly, the shape of the active region AA-ED may be defined substantially by the peripheral region NAA-ED. However, this is merely illustrated as an example, and the peripheral region NAA-ED may be located adjacent to only one side of the active region AA-ED or omitted. The electronic device ED according to one or more embodiments of the present disclosure may include active regions having various shapes, and is not particularly limited.

Here, in FIG. 1 and the following drawings, first direction axis DR1 to third direction axis DR3 are illustrated. The directions indicated as the first to third direction axes DR1, DR2, and DR3 illustrated herein may have a relative concept, and thus may be changed to other directions. The directions indicated as the first to third direction axes DR1, DR2, and DR3 may be referred to as first to third directions, and the same reference symbols may be used. In this specification, the first direction axis DR1 may be perpendicular to the second direction axis DR2, and the third direction axis DR3 may be a normal direction of the plane defined by the first direction axis DR1 and the second direction axis DR2.

The thickness direction of the electronic device ED may be parallel to the third direction axis DR3 that is a normal direction of the plane defined by the first direction axis DR1 and the second direction axis DR2. In this specification, a front surface (or an upper surface) and a rear surface (or a lower surface) of each of members constituting the electronic device ED may be defined with respect to the third direction axis DR3.

The electronic device ED according to one or more embodiments may include a display module DM. The display module DM may be configured to form an image and to sense an input applied from the outside. The display module DM according to one or more embodiments may include a display panel DP and an input sensor ISP located on the display panel DP. Also, the display module DM according to one or more embodiments may further include an optical layer RCL located on the input sensor ISP.

In the display module DM, an active region AA and a peripheral region NAA may be defined. The active region AA may be a region to be activated in response to an electrical signal. The peripheral region NAA may be a region positioned adjacent to at least one side of the active region AA.

The active region AA may correspond to the active region AA-ED of the electronic device illustrated in FIG. 1. The peripheral region NAA may surround the active region AA. However, the present disclosure is not limited thereto. In one or more embodiments, a portion of the peripheral region NAA may be removed in contrast to that which is illustrated in FIG. 2 or the like. A driving circuit, a driving line, or the like for driving the active region AA may be located in the peripheral region NAA.

A plurality of pixels PX may be arranged in the active region AA of the display module DM. The plurality of pixels PX may include a red pixel, a green pixel, and a blue pixel, and may further include a white pixel according to one or more embodiments.

The display panel DP may be configured to substantially generate an image. The display panel DP may be a light emission-type display panel. For example, the display panel DP may be an organic light emitting display panel, an inorganic light emitting display panel, a quantum-dot display panel, a micro-LED display panel, or a nano-LED display panel. The display panel DP may be referred to as a display layer.

The display panel DP include a base layer BS, a circuit layer DP-CL, a light-emitting-element layer DP-ED, and an encapsulation layer TFE.

The base layer BS may be a member that provides a base surface on which the circuit layer DP-CL is located. The base layer BS may be a rigid substrate or a flexible substrate that is bendable, foldable, rollable, or the like. The base layer BS may be a glass substrate, a metal substrate, a polymer substrate, or the like. However, the present disclosure is not limited thereto, and the base layer BS may be an inorganic layer, an organic layer, or a composite material layer.

The base layer BS may have a multi-layer structure. For example, the base layer BS may include a first synthetic resin layer, an intermediate layer of a multi-layer or single-layer structure, and a second synthetic resin layer located on the intermediate layer. The intermediate layer may be referred to as a base barrier layer. The intermediate layer may include a silicon oxide ($SiO_x$) layer and an amorphous silicon (a-Si) layer located on the silicon oxide layer, but the present disclosure is not limited thereto. For example, the intermediate layer may include at least one of a silicon oxide layer, a silicon nitride layer, a silicon oxynitride layer, or an amorphous silicon layer.

Each of the first and second synthetic resin layers may include polyimide-based resin. Also, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. Meanwhile, in this specification, a "-" based resin may be considered as including a "-" functional group.

The circuit layer DP-CL may be located on the base layer BS. The circuit layer DP-CL may include an insulating layer, a semiconductor pattern, a conductive pattern, a signal line, and the like. The insulating layer, the semiconductor layer, and the conductive layer are formed on the base layer BS through processes, such as coating and deposition, and subsequently, the insulating layer, the semiconductor layer, and the conductive layer may be selectively patterned through photolithography processes performed multiple times. Then, the semiconductor pattern, the conductive pattern, and the signal line included in the circuit layer DP-CL may be formed.

The light-emitting-element layer DP-ED may be located on the circuit layer DP-CL. The light-emitting-element layer DP-ED may include a light emitting element. For example, the light-emitting-element layer DP-ED may include an organic light emitting material, an inorganic light emitting material, an organic-inorganic light emitting material, a quantum dot, a quantum rod, a micro LED, a nano LED, or the like.

The encapsulation layer TFE may be located on the light-emitting-element layer DP-ED. The encapsulation layer TFE may protect the light-emitting-element layer DP-ED from foreign substances, such as moisture, oxygen, and dust particles.

The input sensor ISP may be located on the display panel DP. The input sensor ISP may sense an external input applied from the outside. The external input may be an input of a user. The input of the user may include various types of external inputs, such as a portion of the user's body, light, heat, a pen, or pressure.

The input sensor ISP may be formed on the display panel DP through a continuous process. In this case, the input sensor ISP may be considered to be located directly on the display panel DP. Being located directly on may mean that an intervening third component is not located between the input sensor ISP and the display panel DP. That is, a separate adhesive member may not be located between the input sensor ISP and the display panel DP. Also, the input sensor ISP may be coupled to the display panel DP by an adhesive member. The adhesive member may include a general adhesive or bonding agent.

The optical layer RCL may be located on the input sensor ISP. The optical layer RCL may be a reflection reduction layer, or reflection-preventing layer, that reduces reflectivity of external light incident from the outside of the display module DM. The optical layer RCL may be formed on the input sensor ISP through a continuous process. The optical layer RCL may include a polarizing plate or may include a color filter layer. When the optical layer RCL includes a color filter layer, the color filter layer may include a plurality of color filters arranged in a certain pattern. For example, the color filters may be arranged in consideration of light emitting colors of pixels included in the display panel DP. Also, the optical layer RCL may further include a black matrix adjacent to the color filters. In one or more embodiments of the present disclosure, the optical layer RCL may be omitted.

The electronic device ED may further include a window WM located on the display module DM. The window WM may cover the entire outer side of the display module DM. The window WM may have a shape that conforms to the shape of the display module DM. In the electronic device ED according to one or more embodiments, the window WM may include an optically transparent insulating material. The window WM may be a glass substrate or a polymer substrate. For example, the window WM may be a tempered glass substrate in which strengthening treatment has been performed.

The electronic device ED according to one or more embodiments may include a housing HAU that accommodates the display module DM and the like. The housing HAU may be coupled to the window WM.

Figure 4:
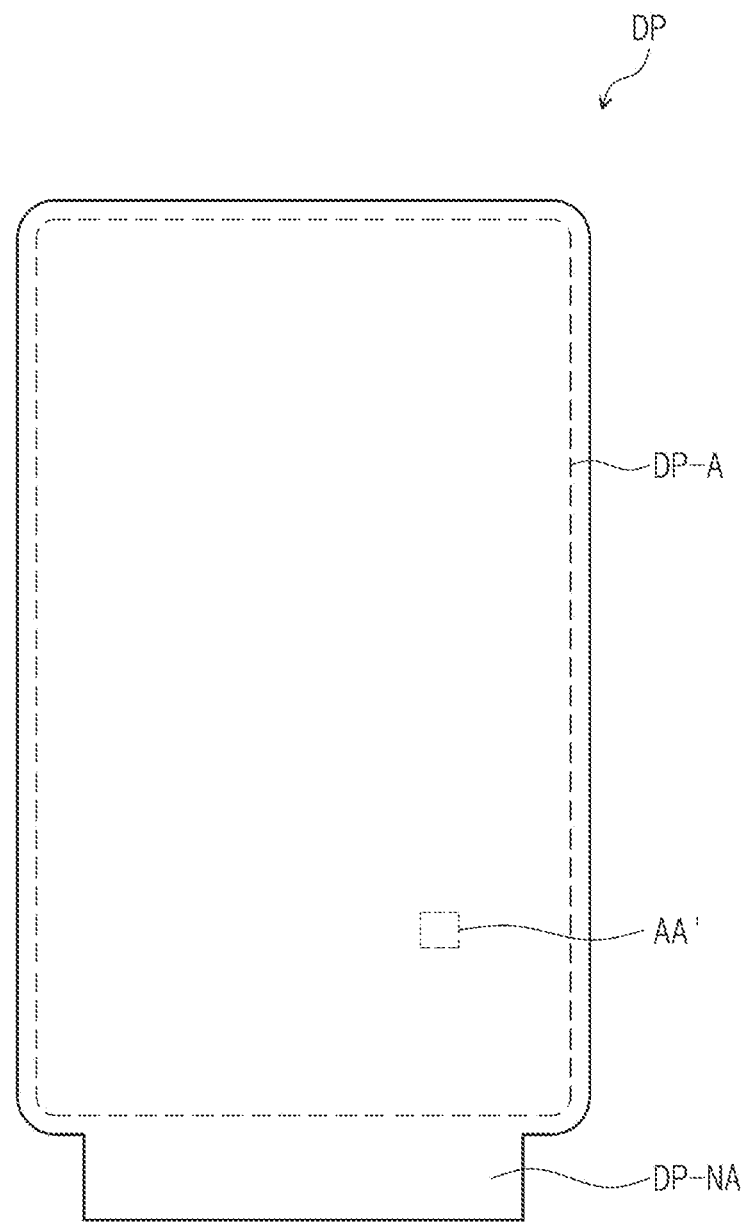
FIG. 4 is a plan view of a display panel according to one or more embodiments.

FIG. 4 is a plan view of a display panel according to one or more embodiments of the present disclosure. The display panel DP may include an active region DP-A and a peripheral region DP-NA. The active region DP-A of the display panel DP may be referred to as a display region, and the peripheral region DP-NA of the display panel DP may be referred to as a non-display region.

In the display panel DP according to one or more embodiments, the peripheral region DP-NA may be adjacent to the active region DP-A and may surround at least a portion of the active region DP-A. The peripheral region DP-NA may be located on one side of the active region DP-A. A driving element for driving the display panel DP, a line, etc. may be arranged in the peripheral region DP-NA located on one side of the active region DP-A.

The display panel DP may include a plurality of pixels PX. The plurality of pixels PX may include a red pixel, a green pixel, and a blue pixel, and may further include a white pixel according to one or more embodiments.

Figure 5:
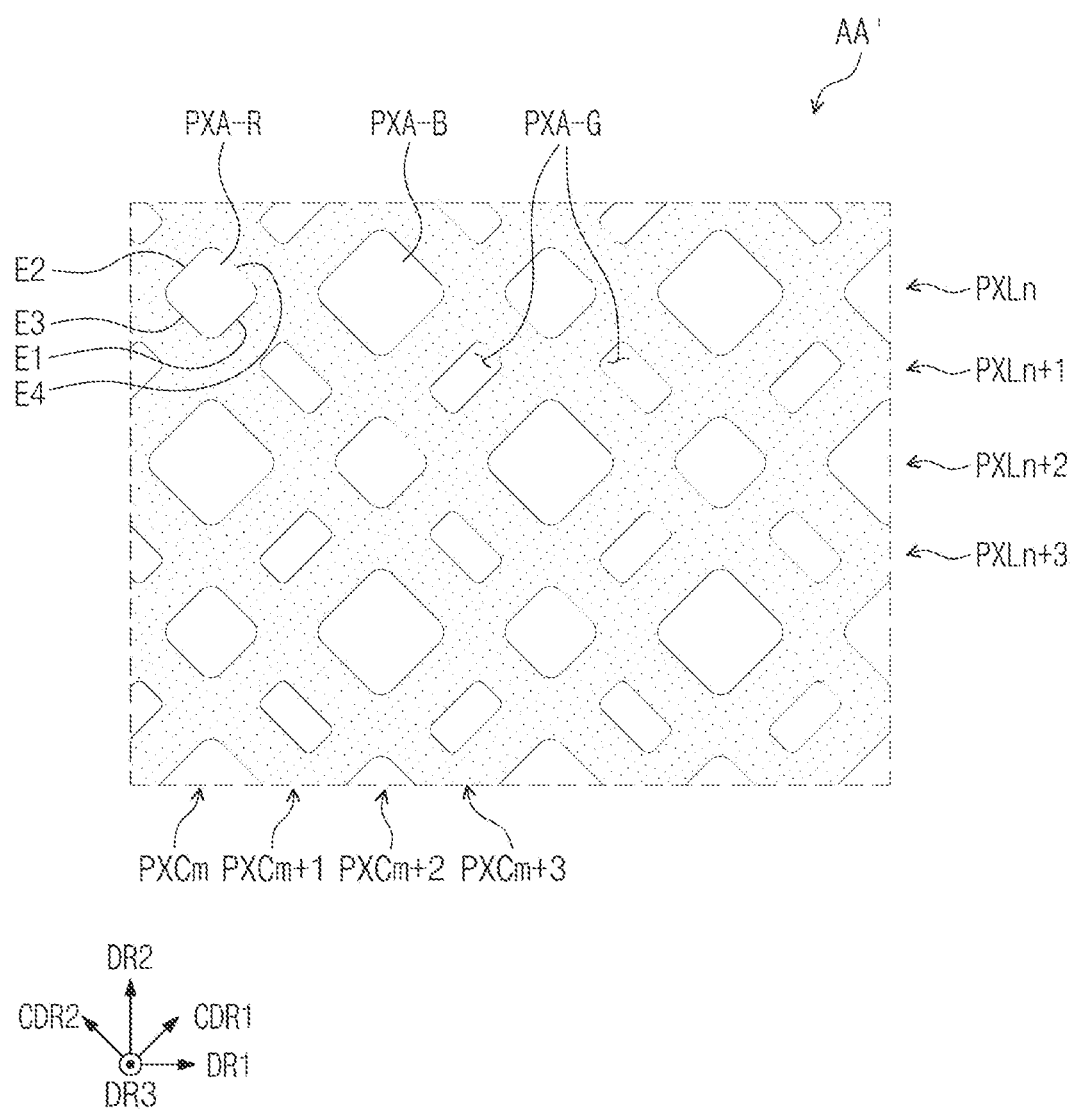
FIG. 5 is a plan view showing a portion of a display panel according to one or more embodiments.

FIG. 5 is a plan view showing a portion of a display panel according to one or more embodiments. FIG. 5 may be a view corresponding to a region AA' of FIG. 4.

The active region DP-A of the display panel may include a plurality of light-emitting regions PXA-R, PXA-G, and PXA-B, and a non-light-emitting region NPXA located between the plurality of the light-emitting regions PXA-R, PXA-G, and PXA-B.

Figure 6:
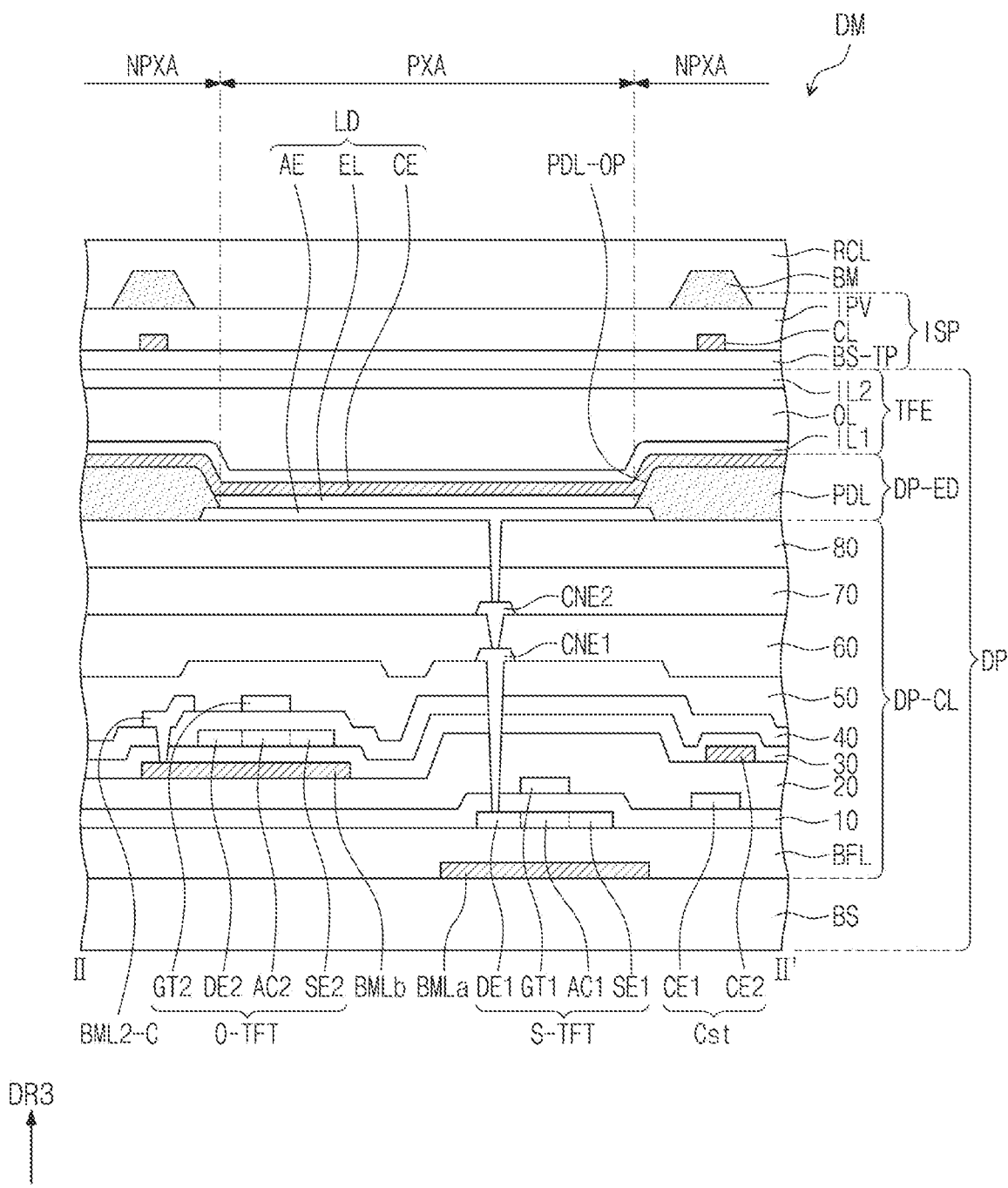
FIG. 6 is a cross-sectional view of a display module according to one or more embodiments.

The plurality of light-emitting regions PXA-R, PXA-G, and PXA-B may be divided into three groups of light-emitting regions PXA-B, PXA-R, and PXA-G. The three groups of light-emitting regions PXA-B, PXA-R, and PXA-G may be defined according to the colors of source light generated in a light emitting element LD (FIG. 6).

The areas of a first color light-emitting region PXA-R, a second color light-emitting region PXA-G, and a third color light-emitting region PXA-B may be different from each other. However, the present disclosure is not limited thereto, and at least one of the areas of the first color light-emitting region PXA-R, the second color light-emitting region PXA-G, and the third color light-emitting region PXA-B may be different from the other areas. In one or more embodiments, the first color may be red, the second color may be green, and the third color may be blue. Also, in one or more embodiments unlike the above, the display panel DP may include three groups of light-emitting regions that respectively display three main colors, such as yellow, magenta, and cyan.

Each of the first color light-emitting region PXA-R, the second color light-emitting region PXA-G, and the third color light-emitting region PXA-B may have a "substantially polygonal shape." Here, the "substantially polygonal shape" includes a polygon in a mathematical sense and a polygon in which curves are defined at vertices. The shape of the light-emitting region corresponds to the shape of a pixel opening PDL-OP (FIG. 6) formed in a pixel-defining layer, and the shapes of vertices may be changed according to the etching capability of the pixel-defining layer.

In one or more embodiments, the first color light-emitting region PXA-R having a square shape, the second color light-emitting region PXA-G having a square shape, and the third color light-emitting region PXA-B having a square shape may be illustrated. The second color light-emitting region PXA-G may include two types of second color light-emitting regions PXA-G in which long sides extend in different directions.

Each of the first color light-emitting region PXA-R, the second color light-emitting region PXA-G, and the third color light-emitting region PXA-B includes a first edge E1 to a fourth edge E4. The first edge E1 and the second edge E2 may extend in a first diagonal direction CDR1 intersecting with a first direction DR1 and a second direction DR2, and may be spaced apart from each other with a corresponding light-emitting region therebetween. The third edge E3 and the fourth edge E4 may extend in a second diagonal direction CDR2 intersecting with the first direction DR1, the second direction DR2, and the first diagonal direction CDR1, and may be spaced apart from each other with a corresponding light-emitting region therebetween.

Referring to FIG. 5, the plurality of light-emitting regions PXA-B, PXA-R, and PXA-G may define a plurality of light-emitting rows that are arranged in the second direction DR2. The light-emitting rows may include an n-th light-emitting row PXLn, an (n+1)th light-emitting row PXLn+1, an (n+2)th light-emitting row PXLn+2, and an (n+3)th light-emitting row PXLn+3 (where n is an integer of one or more). The four light-emitting rows PXLn, PXLn+1, PXLn+2, and PXLn+3 may form a unit, and may be repeatedly arranged in the second direction DR2. Each of the four light-emitting rows PXLn, PXLn+1, PXLn+2, and PXLn+3 may extend in the first direction DR1.

The n-th light-emitting row PXLn may include first color light-emitting regions PXA-R and third color light-emitting regions PXA-B that are alternately arranged in the first direction DR1. The (n+2)th light-emitting row PXLn+2 may include third color light-emitting regions PXA-B and first color light-emitting regions PXA-R that are alternately arranged in the first direction DR1.

The arrangement order of the light-emitting regions of the n-th light-emitting row PXLn may be different from the arrangement order of the light-emitting regions of the (n+2)th light-emitting row PXLn+2. The third color light-emitting regions PXA-B and the first color light-emitting regions PXA-R in the n-th light-emitting row PXLn may be arranged so as to be respectively offset from the third color light-emitting regions PXA-B and the first color light-emitting regions PXA-R in the (n+2)th light-emitting row PXLn+2. The light-emitting regions in the n-th light-emitting row PXLn may be shifted by one light-emitting region in the second direction DR2, compared to the light-emitting regions in the (n+2)th light-emitting row.

The second color light-emitting regions PXA-G are arranged in each of the (n+1)th light-emitting row PXLn+1 and the (n+3)th light-emitting row PXLn+3. The light-emitting regions in the n-th light-emitting row PXLn and the light-emitting regions in the (n+1)th light-emitting row PXLn+1 may be arranged so as to be offset from each other. The light-emitting regions in the (n+2)th light-emitting row PXLn+2 and the light-emitting regions in the (n+3)th light-emitting row PXLn+3 may be arranged so as to be offset from each other.

Meanwhile, the plurality of light-emitting regions PXA-B, PXA-R, and PXA-G may define a plurality of light-emitting columns that are arranged in the first direction DR1. The light-emitting columns may include an m-th light-emitting column PXCm, an (m+1)th light-emitting column PXCm+1, an (m+2)th light-emitting column PXCm+2, and an (m+3)th light-emitting column PXCm+3 (where m is an integer of one or more). The four light-emitting columns PXCm, PXCm+1, PXCm+2, and PXCm+3 may form a unit, and may be repeatedly arranged in the first direction DR1. Each of the four light-emitting columns PXCm, PXCm+1, PXCm+2, and PXCm+3 may extend in the second direction DR2.

The configurations of the light-emitting regions PXA-B, PXA-R, and PXA-G included in each of the light-emitting columns PXCm, PXCm+1, PXCm+2, and PXCm+3 may be determined according to the arrangement of the light-emitting regions PXA-B, PXA-R, and PXA-G of the light-emitting rows PXLn, PXLn+1, PXLn+2, and PXLn+3 described above. For example, referring to FIG. 5, the m-th light-emitting column PXCm may include the first color light-emitting regions PXA-R and the third color light-emitting regions PXA-B that are alternately arranged in the second direction DR2, and the (m+2)th light-emitting column PXCm+2 may include the third color light-emitting regions PXA-B and the first color light-emitting regions PXA-R that are alternately arranged in the second direction DR2. Also, the second color light-emitting regions PXA-G may be arranged in each of the (m+1)th light-emitting column PXCm+1 and the (m+3)th light-emitting column PXCm+3. However, the present disclosure is not limited thereto.

The arrangement configuration of the light-emitting regions PXA-R, PXA-G, and PXA-B illustrated in FIG. 5 is merely an example, and the present disclosure is not limited thereto. The areas of the light-emitting regions PXA-R, PXA-G, and PXA-G and the arrangement configurations of the light-emitting regions PXA-R, PXA-G, and PXA-G may be changed depending on display quality required by the electronic device.

FIG. 6 is a cross-sectional view of a portion of a display module according to one or more embodiments. FIG. 6 may show a portion corresponding to the line II-II' of FIG. 2.

Referring to FIG. 6, the display panel DP may include a plurality of insulating layers, semiconductor patterns, conductive patterns, signal lines, and the like. The insulating layers, the semiconductor layers, and the conductive layers may be formed through a method of coating, deposition, or the like. Subsequently, the insulating layers, the semiconductor layers, and the conductive layers may be selectively patterned by a photolithography method. The semiconductor patterns, the conductive patterns, the signal lines, and the like, that are provided in the circuit layer DP-CL and the light-emitting-element layer DP-ED, may be formed by the methods described above. Subsequently, the encapsulation layer TFE for covering the light-emitting-element layer DP-ED may be formed.

FIG. 6 illustrates a light emitting element LD and a pixel circuit that includes a silicon thin film transistor S-TFT and an oxide thin film transistor O-TFT for driving the light emitting element LD.

The buffer layer BFL may be located on the base layer BS. The buffer layer BFL may reduce or prevent diffusion of metal atoms or impurities from the base layer BS into a first semiconductor pattern. Also, the buffer layer BFL may control a heat supply rate during a crystallization process for forming the first semiconductor pattern, and thus, the first semiconductor pattern may be uniformly formed.

A first rear metal layer BMLa may be located below the silicon thin film transistor S-TFT, and a second rear metal layer BMLb may be located below the oxide thin film transistor O-TFT. The first and second rear metal layers BMLa and BMLb may overlap the silicon thin film transistor S-TFT and the oxide thin film transistor O-TFT so as to protect the silicon thin film transistor S-TFT, the oxide thin film transistor O-TFT, and the like. The first and second rear metal layers BMLa and BMLb may reduce or prevent an electric potential due to the polarization of the base layer BS from affecting the silicon thin film transistor S-TFT, the oxide thin film transistor O-TFT, and the like.

In one or more embodiments, the first rear metal layer BMLa may be located overlapping a driving thin film transistor provided in the silicon thin film transistor S-TFT.

The first rear metal layer BMLa may be located between the base layer BS and the buffer layer BFL. In one or more embodiments of the present disclosure, the first rear metal layer BMLa may be located on the base layer BS in which an organic film and an inorganic film are alternately stacked. Also, the first rear metal layer BMLa may be located inside the buffer layer BFL. In this case, an inorganic barrier layer may be further located between the first rear metal layer BMLa and the buffer layer BFL. The first rear metal layer BMLa may be connected to an electrode or to a line and may receive a constant voltage or signal therefrom. In one or more other embodiments, the first rear metal layer BMLa may be provided while being isolated from another electrode or line.

The second rear metal layer BMLb may be located to correspond to the lower portion of the oxide thin film transistor O-TFT. The second rear metal layer BMLb may be located between a second insulating layer 20 and a third insulating layer 30. The second rear metal layer BMLb may be located in the same layer as a second electrode CE2 of a storage capacitor Cst. The second rear metal layer BMLb may be connected to a contact electrode BML2-C and may receive a constant voltage or signal. The contact electrode BML2-C may be located in the same layer as a gate GT2 of the oxide thin film transistor O-TFT.

Each of the first rear metal layer BMLa and the second rear metal layer BMLb may include a reflective metal. For example, each of the first rear metal layer BMLa and the second rear metal layer BMLb may include silver (Ag), an alloy containing silver, molybdenum (Mo), an alloy containing molybdenum, aluminum (Al), an alloy containing aluminum, an aluminum nitride (AlN), tungsten (W), a tungsten nitride (WN), copper (CU), titanium (Ti), amorphous silicon doped with P+, and the like. The first rear metal layer BMLa and the second rear metal layer BMLb may include the same material or may include different materials.

The first semiconductor pattern may be located on the base layer BFL. The first semiconductor pattern may include a silicon semiconductor. For example, the silicon semiconductor may include amorphous silicon, polycrystalline silicon, and the like. For example, the first semiconductor pattern may include low-temperature polysilicon.

FIG. 6 illustrates only a portion of the first semiconductor pattern located on the buffer layer BFL, and the first semiconductor pattern may be further located in another region. The first semiconductor pattern may be arranged in a corresponding arrangement over the pixels. The first semiconductor pattern may have different electrical properties depending on whether the first semiconductor pattern is doped or not. The first semiconductor pattern may include a first region having high conductivity and a second region having low conductivity. The first region may be doped with an N-type dopant or a P-type dopant. A P-type transistor may include a doped region that is doped with the P-type dopant, and an N-type transistor may include a doped region that is doped with the N-type dopant. The second region may be a non-doped region or a region doped at a lower concentration than that of the first region.

The electrical conductivity of the first region is greater than the electrical conductivity of the second region, and the first region may substantially serve as an electrode or a signal line. The second region may substantially correspond to an active region (or a channel) of a transistor. That is, a portion of the semiconductor pattern may be the active region of the transistor, another portion thereof may be a source or a drain of the transistor, and the other portion thereof may be a connection electrode or a connection signal line.

A source region SE1, an active portion AC1, and a drain region DE1 of the silicon thin film transistor S-TFT may be formed from the first semiconductor pattern. The source region SE1 and the drain region DE1 may extend from the active portion AC1 in directions opposite to each other when viewed in the cross-sectional view.

A first insulating layer 10 may be located on the buffer layer BFL. The first insulating layer 10 may overlap all of the pixels PX (FIG. 2) in common, and may cover the first semiconductor pattern. The first insulating layer 10 may be an inorganic layer and/or an organic layer, and may have a single-layer or multi-layer structure. The first insulating layer 10 may include at least one of an aluminum oxide, a titanium oxide, a silicon oxide, a silicon nitride, a silicon oxynitride, a zirconium oxide, or a hafnium oxide. In one or more embodiments, the first insulating layer 10 may be a single-layered silicon oxide layer. An insulating layer of the circuit layer DP-CL, which will be described later, as well as the first insulating layer 10 may be an inorganic layer and/or an organic layer, and may have a single-layer or multi-layer structure. The inorganic layer may include at least one of the materials described above, and the present disclosure is not limited thereto.

A gate GT1 of the silicon thin film transistor S-TFT may be located on the first insulating layer 10. The gate GT1 may be a portion of a metal pattern. The gate GT1 overlaps the active portion AC1. During a process of doping the first semiconductor pattern, the gate GT1 may serve as a mask. The gate GT1 may include titanium (Ti), silver (Ag), an alloy containing silver, molybdenum (Mo), an alloy containing molybdenum, aluminum (AI), an alloy containing aluminum, an aluminum nitride (AlN), tungsten (W), a tungsten nitride (WN), copper (Cu), an indium tin oxide (ITO), an indium zinc oxide (IZO), or the like, but the present disclosure is not limited thereto.

The second insulating layer 20 may be located on the first insulating layer 10 and may cover the gate GT1. The second insulating layer 20 may be an inorganic layer and/or an organic layer and may have a single-layer or multi-layer structure. The second insulating layer 20 may include at least one of a silicon oxide, a silicon nitride, or a silicon oxynitride. In one or more embodiments, the second insulating layer 20 may have a multi-layer structure that includes a silicon oxide layer and a silicon nitride layer.

The third insulating layer 30 may be located on the second insulating layer 20. The third insulating layer 30 may have a single-layer or multi-layer structure. For example, the third insulating layer 30 may have a multi-layer structure that includes a silicon oxide layer and a silicon nitride layer. The second electrode CE2 of the storage capacitor Cst may be located between the second insulating layer 20 and the third insulating layer 30. Also, a first electrode CE1 of the storage capacitor Cst may be located between the first insulating layer 10 and the second insulating layer 20.

A second semiconductor pattern may be located on the third insulating layer 30. The second semiconductor pattern may include an oxide semiconductor. The oxide semiconductor may include a plurality of regions divided according to whether or not the metal oxide is reduced. A region in which the metal oxide is reduced (hereinafter, referred to as a reduction region) has greater electrical conductivity than a region in which the metal oxide is not reduced (hereinafter, referred to as a non-reduction region). The reduction region substantially serves as a source/drain of a transistor or a signal line. The non-reduction region substantially serves as an active region (or a semiconductor region, a channel) of a transistor. That is, a portion of the second semiconductor pattern may be the active region of the transistor, another portion thereof may be a source/drain region of the transistor, and the other portion thereof may be a signal transmission region.

A source region SE2, an active portion AC2, and a drain region DE2 of the oxide thin film transistor O-TFT may be formed from the second semiconductor pattern. The source region SE2 and the drain region DE2 may extend from the active portion AC2 in directions opposite to each other when viewed in the cross-sectional view.

The fourth insulating layer 40 may be located on the third insulating layer 30. The fourth insulating layer 40 may overlap all of the pixels PX (FIG. 2) in common and may cover the second semiconductor pattern. The fourth insulating layer 40 may include at least one of an aluminum oxide, a titanium oxide, a silicon oxide, a silicon nitride, a silicon oxynitride, a zirconium oxide, or a hafnium oxide.

The gate GT2 of the oxide thin film transistor O-TFT may be located on the fourth insulating layer 40. The gate GT2 may be a portion of a metal pattern. The gate GT2 overlaps the active portion AC2. During a process of doping the second semiconductor pattern, the gate GT2 may serve as a mask.

A fifth insulating layer 50 may be located on the fourth insulating layer 40 and may cover the gate GT2. The fifth insulating layer 50 may be an inorganic layer and/or an organic layer and may have a single-layer or multi-layer structure.

A first connection electrode CNE1 may be located on the fifth insulating layer 50. The first connection electrode CNE1 may be connected to the drain region DE1 of the silicon thin film transistor S-TFT via a contact hole that passes through the first to fifth insulating layers 10, 20, 30, 40, and 50. FIG. 6 illustrates that the first connection electrode CNE1 is directly connected to the drain region DE1 of the silicon thin film transistor S-TFT, but the first connection electrode CNE1 may be electrically connected to the drain region DE1 via a light emitting control thin film transistor in one or more other embodiments.

A sixth insulating layer 60 may be located on the fifth insulating layer 50. A second connection electrode CNE2 may be located on the sixth insulating layer 60. The second connection electrode CNE2 may be connected to the first connection electrode CNE1 via a contact hole that passes through the sixth insulating layer 60. A seventh insulating layer 70 may be located on the sixth insulating layer 60 and may cover the second connection electrode CNE2. An eighth insulating layer 80 may be located on the seventh insulating layer 70.

Each of the sixth insulating layer 60, the seventh insulating layer 70, and the eighth insulating layer 80 may be an inorganic layer. For example, each of the sixth insulating layer 60, the seventh insulating layer 70, and the eighth insulating layer 80 may include a general-purpose polymer, such as benzocyclobutene (BCB), polyimide (PI), hexamethyldisiloxane (HMDSO), polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The light-emitting-element layer DP-ED including light emitting elements LD may be located on the circuit layer DP-CL. Each of the light emitting elements LD may include a pixel electrode AE, a light-emitting layer EL, and a common electrode CE. The pixel electrodes AE may be spaced apart from each other to correspond to the respective pixels PX (FIG. 2), and the common electrode CE may be provided in common for the plurality of pixels PX (FIG. 2).

The pixel electrode AE may be located on the eighth insulating layer 80. The pixel electrode AE may be made of a metal material, a metal alloy, or a conductive compound. The pixel electrode AE may be an anode or a cathode. However, the present disclosure is not limited thereto. The pixel electrode AE may be a transmissive electrode, a transflective electrode, or a reflective electrode. When the pixel electrode AE is a transmissive electrode, the pixel electrode AE may include a transparent metal oxide, for example, indium tin oxide (ITO), indium zinc oxide (IZO), zinc oxide (ZnO), indium tin zinc oxide (ITZO), or the like. When the pixel electrode AE is a transflective electrode or a reflective electrode, the pixel electrode AE may include Ag, Mg, Cu, Al, Pt, Pd, Au, Ni, Nd, Ir, Cr, Li, Ca, LiF/Ca, LiF/Al, Mo, Ti, W, or a compound or mixture thereof (e.g., a mixture of Ag and Mg). Also, the pixel electrode AE may have a multi-layer structure that includes a reflective film or a transflective film made of the materials described above, and a transparent conductive film made of indium tin oxide (ITO), indium zinc oxide (IZO), zinc oxide (ZnO), indium tin zinc oxide (ITZO), or the like. For example, the pixel electrode AE may have a three-layer structure of ITO/Ag/ITO, but the present disclosure is not limited thereto. Also, the present disclosure is not limited thereto, and the pixel electrode AE may include the metal materials described above, a combination of two or more metal materials selected from the metal materials described above, oxides of the metal materials described above, or the like.

A pixel-defining layer PDL may be located on the eighth insulating layer 80. In one or more embodiments, the pixel-defining layer PDL may be made of a polymer resin. For example, the pixel-defining layer PDL may include a polyacrylate-based resin or a polyimide-based resin. Also, the pixel-defining layer PDL may further include an inorganic material in addition to the polymer resin. Meanwhile, the pixel-defining layer PDL may include a light-absorbing material or may include black pigment or black dye. The pixel-defining layer PDL including the black pigment or black dye may constitute a black pixel-defining layer. Carbon black or the like may be used as the black pigment or black dye when the pixel-defining layer PDL is formed, but the present disclosure is not limited thereto.

Also, the pixel-defining layer PDL may be made of an organic material. For example, the pixel-defining layer PDL may include a silicon nitride, a silicon oxide, a silicon oxynitride, or the like.

The pixel-defining layer PDL may cover a portion of the pixel electrode AE. For example, a pixel opening PDL-OP, through which a portion of the pixel electrode AE is exposed, may be defined in the pixel defining PDL. The pixel-defining layer PDL may increase the distance between the common electrode CE and an edge of the pixel electrode AE. Thus, the pixel-defining layer PDL may reduce or prevent the likelihood of an arc or the like occurring at the edge of the pixel electrode AE.

In the display panel DP according to one or more embodiments, the light-emitting regions PXA may be divided by the pixel-defining layer PDL. The display panel DP may include light-emitting regions PXA and a non-light-emitting region NPXA, and the non-light-emitting region NPXA may overlap the pixel-defining layer PDL. A portion corresponding to the pixel electrode AE exposed in the pixel opening PDL-OP may be defined as a light-emitting region PXA.

In the light emitting element LD, the light-emitting layer EL may be located on the pixel electrode AE. In one or more embodiments, the light-emitting layer EL may emit light of at least one of blue, red, or green.

The common electrode CE may be located on the light-emitting layer EL. The common electrode CE may have a single integrated shape and may be located in common with respect to the plurality of pixels PX (FIG. 2). The common electrode CE may be a cathode or anode, but the present disclosure is not limited thereto. For example, when the pixel electrode AE is an anode, the common electrode CE may be a cathode. When the pixel electrode AE is a cathode, the common electrode CE may be an anode.

The common electrode CE may be a transmissive electrode, a transflective electrode, or a reflective electrode. When the common electrode CE is a transmissive electrode, the common electrode CE may include a transparent metal oxide, for example, indium tin oxide (ITO), indium zinc oxide (IZO), zinc oxide (ZnO), indium tin zinc oxide (ITZO), or the like. Also, the common electrode CE may include Ag, Mg, Cu, Al, Pt, Pd, Au, Ni, Nd, Ir, Cr, Li, Ca, LiF/Ca, LiF/Al, Mo, Ti, W, or a compound or mixture thereof (e.g., a mixture of Ag and Mg).

In one or more embodiments, a hole control layer may be located between the pixel electrode AE and the light-emitting layer EL. The hole control layer HCL may include a hole transport layer and may further include a hole injection layer. An electron control layer may be located between the light-emitting layer EL and the common electrode CE. The electron control layer may include an electron transport layer, and may further include an electron injection layer. The hole control layer and the electron control layer may be formed in common for the plurality of pixels PX (FIG. 4) by using an open mask.

The encapsulation layer TFE may be located on the light-emitting-element layer DP-ED. The encapsulation layer TFE may include an inorganic layer IL1, an organic layer OL, and an inorganic layer IL2, which are stacked in this order, but layers constituting the encapsulation layer TFE are not limited thereto.

The inorganic layers IL1 and IL2 may protect the light-emitting-element layer DP-ED against moisture and oxygen, and the organic layer OL may protect the light-emitting-element layer DP-ED against impurities, such as dust particles. The inorganic layers IL1 and IL2 may include at least one of a silicon nitride, a silicon oxynitride, a silicon oxide, a titanium oxide, or an aluminum oxide. The organic layer OL may include an acryl-based organic material, but the present disclosure is not limited thereto.

The input sensor ISP may be located on the display panel DP. The input sensor ISP may be referred to as a sensor layer, an input-sensing layer, or an input-sensing panel. The input sensor ISP may include a sensing base layer BS-TP, a first conductive layer CL, and a sensing-insulating layer IPV.

The sensing base layer BS-TP may be located directly on the display panel DP. The sensing base layer BS-TP may be an inorganic layer that includes at least one of a silicon nitride, a silicon oxynitride, or a silicon oxide. Also, the sensing base layer BS-TP may be an organic layer that includes an epoxy-based resin, an acryl-based resin, or an imide-based resin. The sensing base layer BS-TP may have a single-layer structure or a multi-layer structure in which layers are stacked in the third direction DR3.

The first conductive layer CL may have a single-layer structure or a multi-layer structure in which layers are stacked in the third direction DR3.

The conductive layer having the single-layer structure may include a metal layer or a transparent conductive layer. The metal layer may include molybdenum, silver, titanium, copper, aluminum, or an alloy thereof. The transparent conductive layer may include a transparent conductive oxide, such as an indium tin oxide (ITO), an indium zinc oxide (IZO), or an indium zinc tin oxide (IZTO). In addition, the transparent conductive layer may include a conductive polymer, such as PEDOT, metal nanowire, graphene, and the like.

The conductive layer having the multi-layer structure may include metal layers. The metal layers may have, for example, a three-layer structure of titanium/aluminum/titanium. The conductive layer having the multi-layer structure may include at least one metal layer and at least one transparent conductive layer.

The sensing-insulating layer IPV may be located on the first conductive layer CL. The sensing-insulating layer IPV may include an inorganic film. The inorganic film may include at least one of an aluminum oxide, a titanium oxide, a silicon oxide, a silicon nitride, a silicon oxynitride, a zirconium oxide, or a hafnium oxide.

Also, the sensing-insulating layer IPV may include an organic film. The organic film may include at least one of an acryl-based resin, a methacryl-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

In one or more embodiments, the input sensor ISP may further include a second conductive layer located on the first conductive layer CL, in addition to the first conductive layer CL. When the input sensor ISP further includes the second conductive layer, the sensing-insulating layer IPV may be located between the first conductive layer CL and the second conductive layer.

The optical layer RCL may be located on the input sensor ISP. For example, the optical layer RCL may be formed on the input sensor ISP through a continuous process. However, the present disclosure is not limited thereto.

The optical layer RCL may include pigment or dye. Also, in one or more embodiments, the optical layer RCL may include a plurality of filter units through which light having different wavelength ranges pass. The filter units, through which light having different wavelength ranges pass, may be located corresponding to the respective light-emitting regions PXA that are divided by the non-light-emitting region NPXA.

The optical layer RCL may further include a partition pattern BM. The material constituting the partition pattern BM is not particularly limited as long as it absorbs light. The partition pattern BM is a layer having a black color. In one or more embodiments, the partition pattern BM may include a black coloring agent. The black coloring agent may include black dye and black pigment. The black coloring agent may include carbon black, metal, such as chromium, or an oxide thereof.

The partition pattern BM may overlap the first conductive layer CL of the input sensor ISP. The partition pattern BM may reduce or prevent reflection of external light due to the first conductive layer CL.

Figure 7:
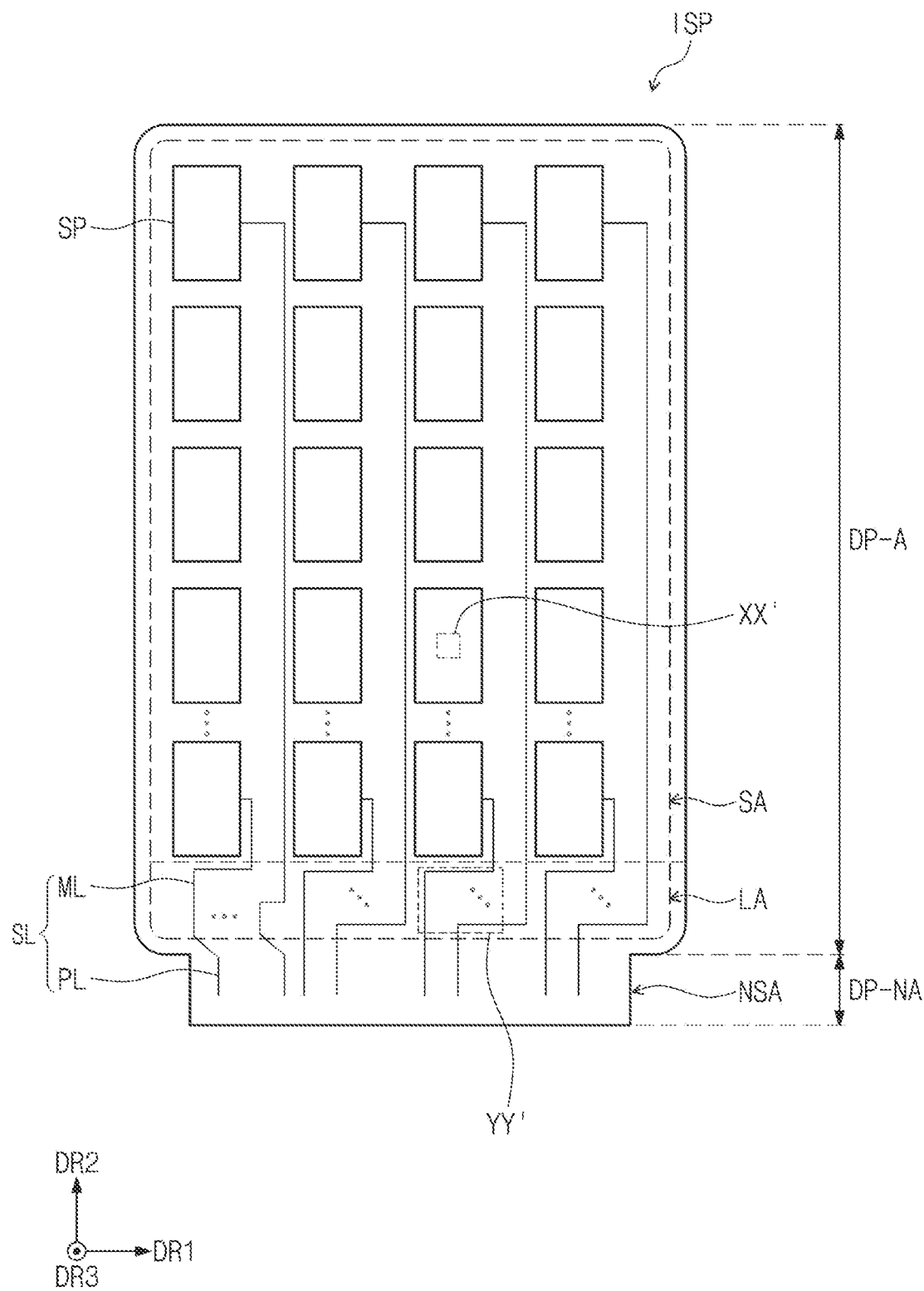
FIG. 7 is a plan view of an input sensor according to one or more embodiments.

FIG. 7 is a plan view showing an input sensor according to one or more embodiments. An input sensor ISP according to one or more embodiments may include a sensing region SA located on the active region AA of the display module, a sensing peripheral region NSA corresponding to the peripheral region of the display module, and a line region LA located between the sensing region SA and the sensing peripheral region NSA. The line region LA may be a region that corresponds to the active region AA.

The sensing region SA of the input sensor ISP may overlap the active region DP-A of the display panel, and the sensing peripheral region NSA may overlap the peripheral region DP-NA of the display panel. The line region LA may overlap the active region DP-A of the display panel adjacent to the peripheral region DP-NA.

The input sensor ISP may include a plurality of sensing electrodes SP and a plurality of sensing lines SL. The sensing lines SL may correspond to the plurality of sensing electrodes SP, respectively, and may be connected thereto. Each of the sensing lines SL may include a peripheral line PL located in the sensing peripheral region NSA, and a main line ML located in the line region LA. Main lines ML, which are located in the line region LA overlapping the active region DP-A, may have bent portions so as to be arranged in a limited region. That is, each of the main lines ML may include a portion, which extends in a direction parallel to the first direction DR1, and another portion, which extends in a direction parallel to the second direction DR2.

Meanwhile, the sensing region SA may be a portion that may sense an external input applied from the outside. The external input may include various types of inputs provided from the outside of the input sensor ISP. For example, the external input may include a touch from a part of the user's body, such as a hand and include an external input (for example, hovering) applied when approaching the input sensor ISP or brought close thereto within a distance (e.g., predetermined distance). Also, the external inputs may have various types, such as force, pressure, temperature, and light.

In the input sensor ISP according to one or more embodiments, the line region LA may be a non-sensing region in which the external input is not sensed. The line region LA is located corresponding to the active region AA, and thus the light-emitting regions PXA-R, PXA-G, and PXA-B may be arranged thereon. However, the line region LA does not sense an external input because the sensing electrodes SP are not arranged thereon.

Figure 8A:
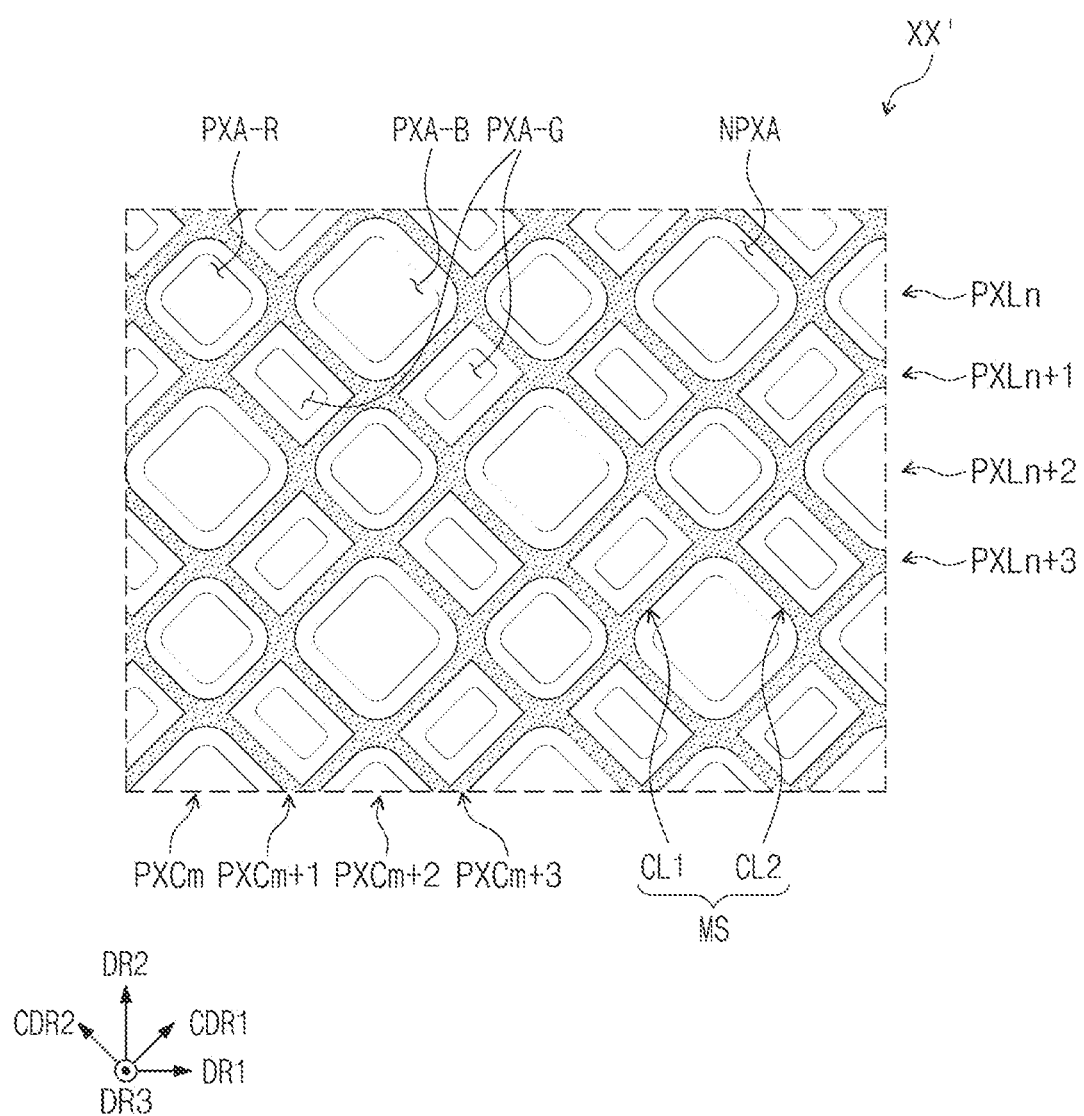
FIG. 8A is an enlarged plan view showing region XX' of FIG. 7.
Figure 8B:
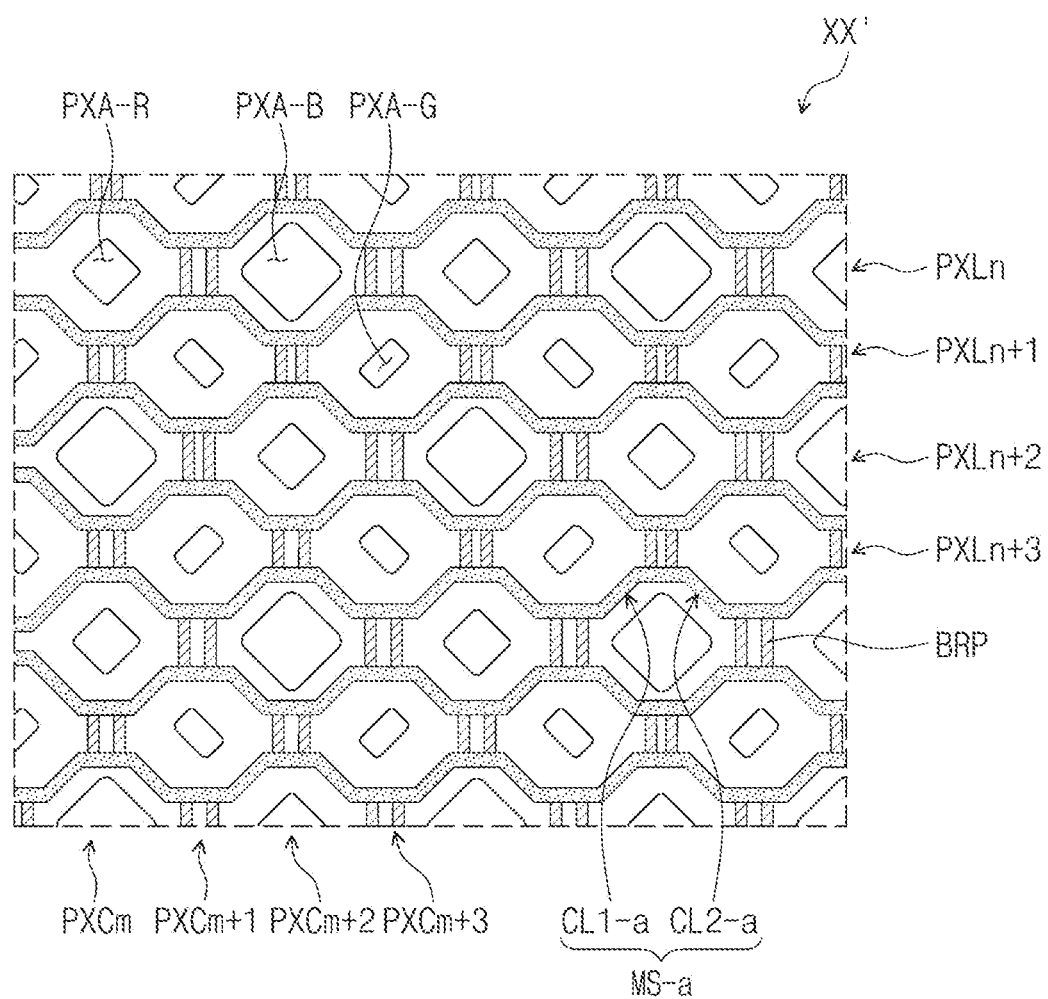
FIG. 8B is an enlarged plan view showing region XX' of FIG. 7.

Each of FIGS. 8A and 8B may be a plan view showing a portion of an input sensor arranged on the display panel. Each of FIGS. 8A and 8B may be an enlarged plan view showing a portion corresponding to region XX' of FIG. 7.

Referring to FIG. 8A, each of the sensing electrodes SP of the input sensor ISP (FIG. 7) may include a plurality of sensing patterns MS that form a mesh shape or a lattice shape. The sensing patterns MS may include first lines CL1 extending in the first diagonal direction CDR1, and second lines CL2 extending in the second diagonal direction CDR2. The first lines CL1 and the second lines CL2 correspond to the first conductive layer CL (FIG. 6) of the input sensor.

Meanwhile, each of the first lines CL1 may not have a perfect straight shape within the first diagonal direction CDR1, but may include a plurality of straight regions and a plurality of inflection regions. Also, the second lines CL2 may include a plurality of straight regions and a plurality of inflection regions.

The first lines CL1 and the second lines CL2 might not overlap the light-emitting regions PXA-R, PXA-G, and PXA-B. That is, the first lines CL1 and the second lines CL2 may overlap the non-light-emitting region NPXA.

Meanwhile, unlike the shape of the sensing patterns MS illustrated in FIG. 8A, the arrangement of lines constituting sensing patterns included in the sensing electrode SP located in the sensing region SA (FIG. 7) in one or more embodiments may be similar to the arrangement of main lines ML (FIG. 9) arranged in the line region that will be described later.

FIG. 8B is a view showing one or more embodiments of an input sensor, and FIG. 8B may show a portion corresponding to region XX' of FIG. 7. In one or more embodiments illustrated in FIG. 8B, the shape of sensing patterns MS-a is different from the shape of the sensing pattern MS illustrated in FIG. 8A.

Referring to FIG. 8B, the sensing patterns MS-a according to one or more embodiments may include first lines CL1-a extending in the first diagonal direction CDR1, and second lines CL2-a extending in the second diagonal direction CDR2. The first lines CL1-a and the second lines CL2-a may not overlap the light-emitting regions PXA-R, PXA-G, and PXA-B, but may arrange along the planar shape of the light-emitting regions PXA-R, PXA-G, PXA-B in the outside of the light-emitting regions PXA-R, PXA-G, and PXA-B.

Also, in one or more embodiments, the sensing electrode SP (FIG. 7) may further include a bridge pattern BRP located between the sensing patterns MS-a. In FIG. 8B, the bridge pattern BRP may be located between portions spaced in the second direction DR2 between neighboring sensing patterns MS-a, and may electrically connect the sensing patterns MS-a. However, the present disclosure is not limited thereto. The lines CL1-a and CL2-a constituting the sensing patterns MS-a may extend in directions different from the extension directions illustrated in FIG. 8B, and the bridge pattern BRP located between the sensing patterns MS-a may also extend in a direction different from the direction illustrated in FIG. 8B and may electrically connect the sensing patterns MS-a.

Also, unlike that illustrated in the drawing, the bridge pattern BRP may not be separated from the sensing pattern MS-a, but may have an integrated shape that extends from the lines CL1-a and CL2-a that constitute the sensing patterns MS-a.

Meanwhile, the shape of the sensing patterns MS and MS-a illustrated in FIGS. 8A and 8B is merely an example, and the present disclosure is not limited thereto.

Figure 9:
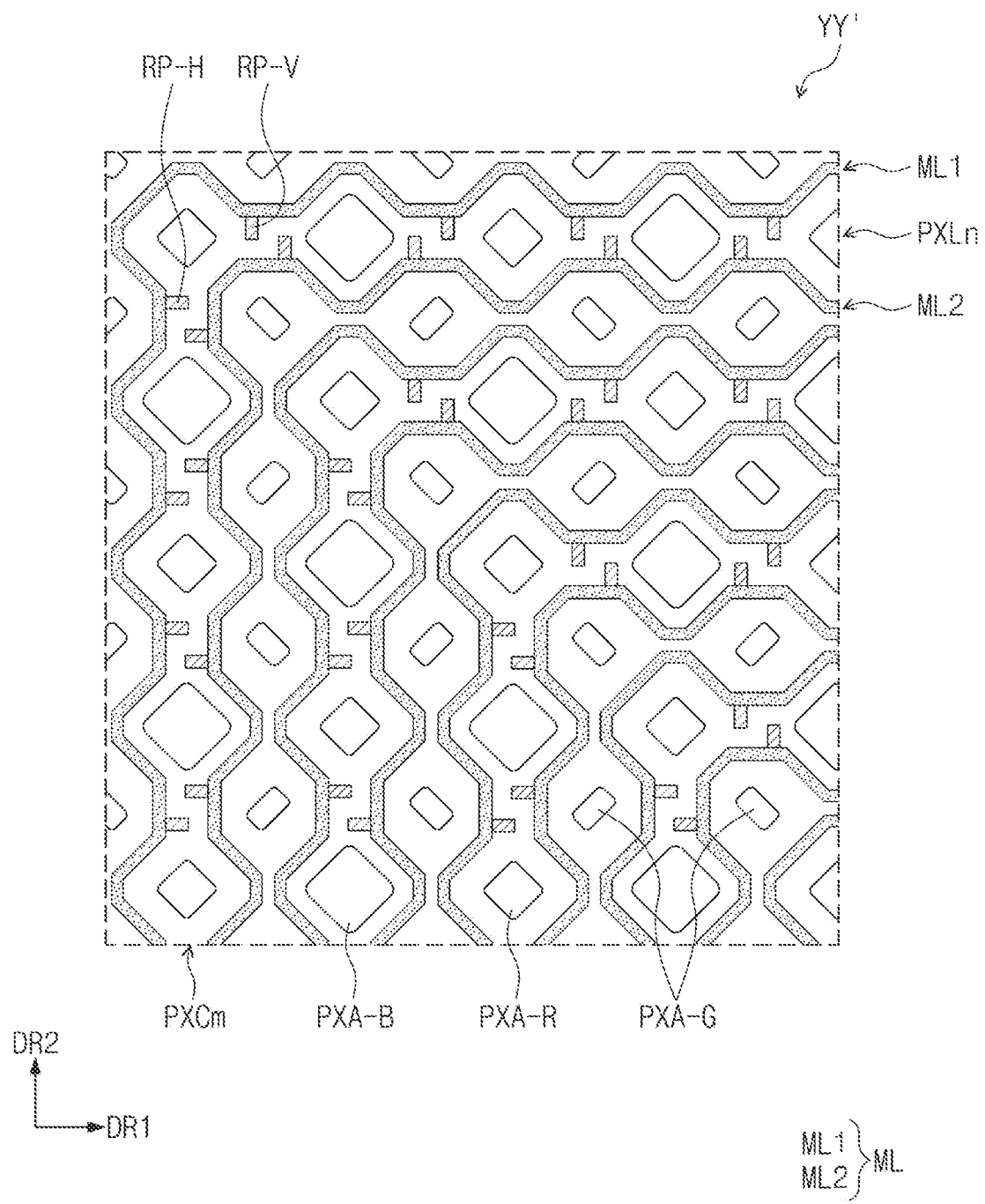
FIG. 9 is an enlarged plan view of region YY' of FIG. 7.
Figure 10:
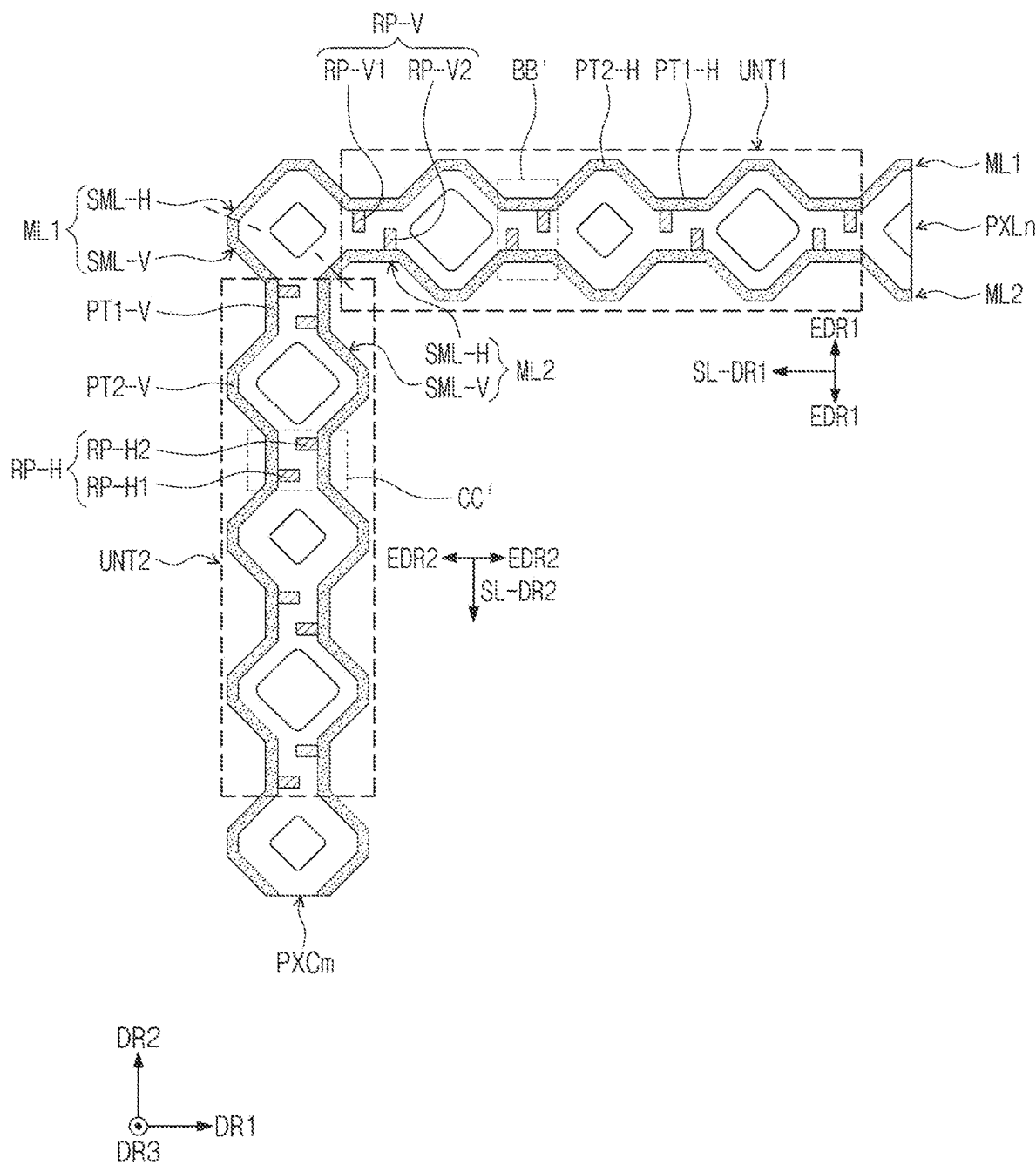
FIG. 10 is a plan view showing a partial configuration of FIG. 9.

FIG. 9 is a plan view showing a portion of an input sensor according to one or more embodiments. FIG. 9 may be an enlarged view showing a portion corresponding to region YY' of FIG. 7. FIG. 10 is an enlarged plan view showing a partial configuration of FIG. 9.

Referring to FIGS. 7 and 9, an input sensor ISP according to one or more embodiments may include sensing electrodes SP, sensing lines SL, and reflection patterns RP-V and RP-H. The plurality of reflection patterns RP-V and RP-H may be located between the sensing lines SL. In one or more embodiments, the sensing lines SL may include a main line ML and a peripheral line PL, and the reflection patterns RP-V and RP-H may be located between main lines ML. The reflection patterns RP-V and RP-H may be formed through the same process as the sensing lines SL. For example, the reflection patterns RP-V and RP-H may include the same material as the main lines ML. However, the present disclosure is not limited thereto.

The main lines ML arranged in the line region LA may not overlap the light-emitting regions PXA-R, PXA-G, and PXA-B. The main lines ML may have a mesh shape similar to the shape of the sensing patterns MS and MS-a illustrated in FIGS. 8A and 8B. The main lines ML may be arranged in the extension direction of the sensing line SL while surrounding the outside of the light-emitting regions PXA-R, PXA-G, and PXA-B. The sensing line SL may be spaced a certain distance from one light-emitting row PXLn or from one light-emitting column PXCm, and may have a shape corresponding to the mesh shape of the sensing patterns MS and MS-a (FIGS. 8A and 8B).

Referring to FIGS. 9 and 10, each of the main lines ML may include a first line SML-H extending in a first extension direction SL-DR1, and a second line SML-V extending in a second extension direction SL-DR2. The second line SML-V may be connected to the first line SML-H and may extend therefrom.

The first extension direction SL-DR1 may be different from the second extension direction SL-DR2. For example, the first extension direction SL-DR1 may be substantially perpendicular to the second extension direction SL-DR2. However, the present disclosure is not limited thereto. In the specification, the first extension direction SL-DR1 is illustrated as being substantially parallel to the first direction DR1, and the second extension direction SL-DR2 is illustrated as being substantially parallel to the second direction DR2. However, this is merely an example, and the present disclosure is not limited thereto.

In one or more embodiments, the reflection patterns RP-V and RP-H may not overlap the light-emitting regions PXA-R, PXA-G, and PXA-B. The reflection patterns RP-V and RP-H may include a first reflection pattern RP-V, which protrudes in a first protrusion direction EDR1 substantially parallel to the second extension direction SL-DR2, and a second reflection pattern RP-H, which protrudes in a second protrusion direction EDR2 substantially parallel to the first extension direction SL-DR1. In FIG. 10, the first protrusion direction EDR1 is illustrated as being parallel to the second direction DR2, and the second protrusion direction EDR2 is illustrated as being parallel to the first direction DR1. However, the present disclosure is not limited thereto. The first protrusion direction EDR1 and the second protrusion direction EDR2 may be determined according to the second extension direction SL-DR2 and the first extension direction SL-DR1.

In one or more embodiments, the first reflection pattern RP-V and the second reflection pattern RP-H may be arranged adjacent to the main lines ML. The first reflection pattern RP-V and the second reflection pattern RP-H may be connected to the main lines ML. For example, in one or more embodiments illustrated in FIGS. 9 and 10, the first reflection pattern RP-V may be connected to the first line SML-H, and the second reflection pattern RP-H may be connected to the second line SML-V. However, the present disclosure is not limited thereto, and some of the plurality of reflection patterns RP-V and RP-H may not be connected to the main lines ML, but may be spaced apart from the main lines ML.

Referring to FIGS. 9 and 10, in one or more embodiments, the main lines ML may include a first main line ML1 and a second main line ML2 that are arranged adjacent to each other with an n-th light-emitting row PXLn among the plurality of light-emitting rows, and with an m-th light-emitting column PXCm therebetween. Each of the first main line ML1 and the second main line ML2 may include a first line SML-H extending in the first extension direction SL-DR1, and a second line SML-V extending in the second extension direction SL-DR2.

The first reflection pattern RP-V may be located between the first line SML-H of the first main line ML1 and the first line SML-H of the second main line ML2. The second reflection pattern RP-H may be located between the second line SML-V of the first main line ML1 and the second line SML-V of the second main line ML2.

The first reflection pattern RP-V may be located between the light-emitting regions PXA-R, PXA-G, and PXA-B that are adjacent to each other in the first direction DR1 at the n-th light-emitting row PXLn. A plurality of first reflection patterns RP-V may be located between the light-emitting regions PXA-R, PXA-G, and PXA-B that are adjacent to each other.

In one or more embodiments, the first reflection pattern RP-V may include a first sub-reflection pattern RP-V1 connected to the first line SML-H of the first main line ML1, and a second sub-reflection pattern RP-V2 connected to the first line SML-H of the second main line ML2. The first sub-reflection pattern RP-V1 and the second sub-reflection pattern RP-V2 may be located between the first main line ML1 and the second main line ML2 that are adjacent to each other, and the first sub-reflection pattern RP-V1 and the second sub-reflection pattern RP-V2 may be spaced apart from each other in the first extension direction SL-DR1.

The second reflection pattern RP-H may be located between the light-emitting regions PXA-R, PXA-G, and PXA-B that are adjacent to each other in the second direction DR2 at the m-th light-emitting column. A plurality of second reflection patterns RP-H may be located between the light-emitting regions PXA-R, PXA-G, and PXA-B that are adjacent to each other. In one or more embodiments, the second reflection pattern RP-H may include a third sub-reflection pattern RP-H1 connected to the second line SML-V of the first main line ML1 and a fourth sub-reflection pattern RP-H2 connected to the second line SML-V of the second main line ML2. The third sub-reflection pattern RP-H1 and the fourth sub-reflection pattern RP-H2 may be located between the first main line ML1 and the second main line ML2 that are adjacent to each other, and the third sub-reflection pattern RP-H1 and the fourth sub-reflection pattern RP-H2 may be spaced apart from each other in the second extension direction SL-DR2.

Referring to FIGS. 9 and 10, the first sub-reflection pattern RP-V1 and the second sub-reflection pattern RP-V2, which are parallel to the first protrusion direction EDR1, may respectively protrude from the main lines ML1 and ML2 connected thereto in directions toward the main lines ML1 and ML2 adjacent thereto. However, the present disclosure is not limited thereto. The protrusion direction of the first sub-reflection pattern RP-V1 and the second sub-reflection pattern RP-V2 may change under the condition that the first sub-reflection pattern RP-V1 and the second sub-reflection pattern RP-V2 do not overlap the light-emitting regions PXA-R, PXA-G, and PXA-B and are parallel to the first protrusion direction EDR1.

The sum of the lengths, in the first protrusion direction EDR1, of surfaces on one side of the sub-reflection patterns RP-V1 and RP-V2 arranged between the first main line ML1 and the second main line ML2 of a first unit length UNT1 may be equal to the sum of the lengths, in the second extension direction SL-DR2, of surfaces on one side of third sections PT1-V of the first main line ML1 and the second main line ML2 of a second unit length UNT2 corresponding to the first unit length UNT1.

In one or more embodiments that include the sub-reflection patterns RP-V1 and RP-V2 protruding in parallel to each other in the first protrusion direction EDR1, the amount of the light reflected from the sub-reflection patterns RP-V1 and RP-V2, among the light incident in a direction parallel to the first extension direction SL-DR1, may increase. Accordingly, the difference between the amount of the light reflected from the third sections PT1-V with respect to the light incident in a direction parallel to the first extension direction SL-DR1, and the amount of the light reflected from the input sensor without the third sections PT1-V with respect to the light incident in a direction parallel to the first extension direction SL-DR1, may be reduced. In one or more embodiments, the difference in reflection amounts of the light incident according to the extension direction of the main lines ML1 and ML2 is reduced, and thus the visibility of the sensing line due to the reflected light may be reduced. Accordingly, display quality of the electronic device according to one or more embodiments may be improved.

In one or more embodiments that include the sub-reflection patterns RP-H1 and RP-H2 protruding in parallel to each other in the second protrusion direction EDR2, the amount of the light reflected from the sub-reflection patterns RP-H1 and RP-H2, among the light incident in a direction parallel to the second extension direction SL-DR2, may increase. Accordingly, the difference between the amount of the light reflected from first sections PT1-H with respect to the light incident in a direction parallel to the second extension direction SL-DR2, and the amount of the light reflected from the input sensor without the first sections PT1-H with respect to the light incident in a direction parallel to the second extension direction SL-DR2, may be reduced. In one or more embodiments, the difference in reflection amounts of the light incident according to the extension direction of the main lines ML1 and ML2 is reduced, and thus the visibility of the sensing line due to the reflected light may be reduced. Accordingly, display quality of the electronic device according to one or more embodiments may be improved.

Figure 11A:
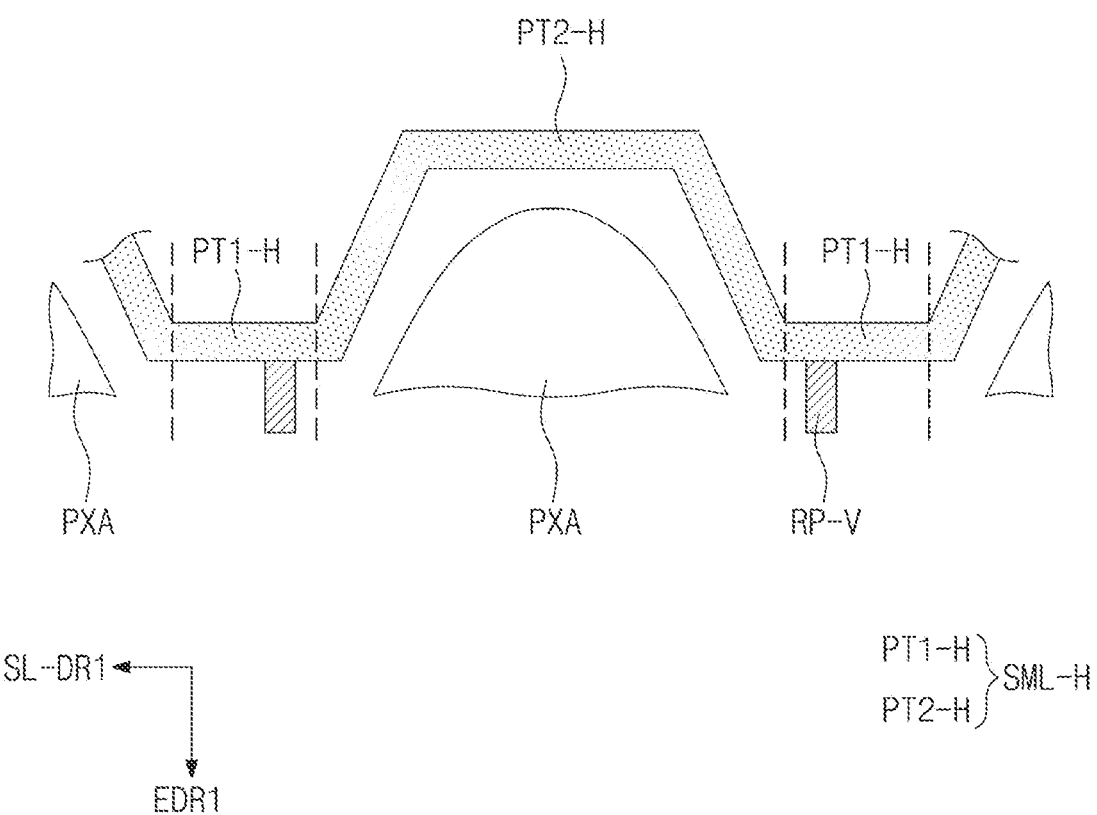
FIG. 11A is an enlarged plan view showing a portion of an input sensor.
Figure 11B:
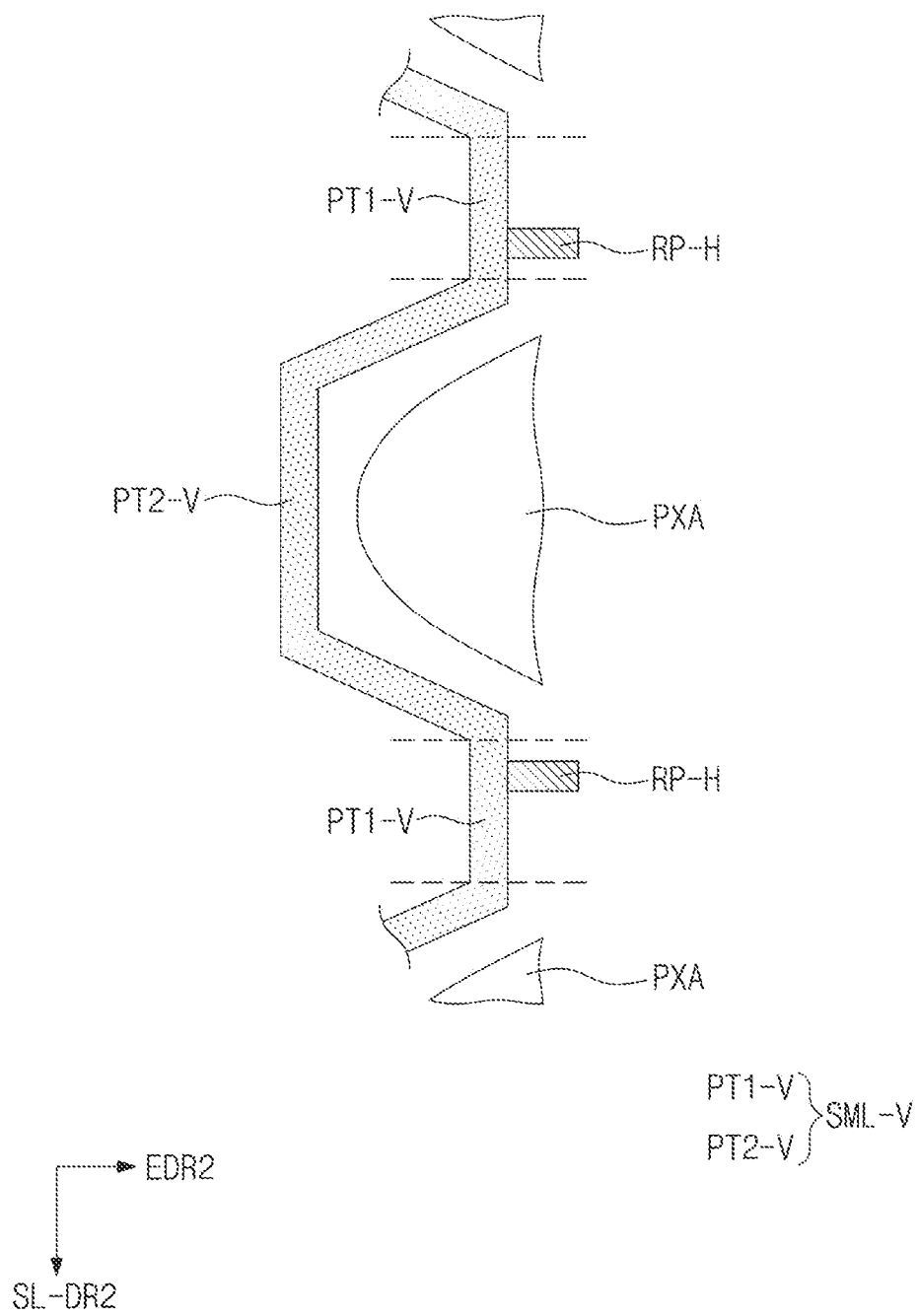
FIG. 11B is an enlarged plan view showing a portion of an input sensor.

Each of FIGS. 11A and 11B is an enlarged plan view showing a portion of an input sensor. Each of FIGS. 11A and 11B is an enlarged plan view showing a portion of an input sensor illustrated in FIG. 10.

FIG. 11A illustrates a portion of the first line SML-H and an arrangement of the first reflection pattern RP-V and the like. FIG. 11A illustrates a light-emitting region PXA and the first line SML-H adjacent thereto. Referring to FIG. 11A, the first line SML-H may include first sections PT1-H parallel to the first extension direction SL-DR1 and a second section PT2-H located between the first sections PT1-H. Each of a plurality of second sections PT2-H may surround each of light-emitting regions PXA. The second sections PT2-H may surround the light-emitting regions PXA spaced in the first protrusion direction EDR1 of the first reflection pattern RP-V.

FIG. 11B illustrates a portion of the second line SML-V and an arrangement of the second reflection pattern RP-H and the like. FIG. 11B illustrates a light-emitting region PXA and the second line SML-V adjacent thereto. Referring to FIG. 11B, the second line SML-V may include third sections PT1-V parallel to the second extension direction SL-DR2 and a fourth section PT2-V located between the third sections PT1-V. Each of a plurality of fourth sections PT2-V may surround each of light-emitting regions PXA. The fourth sections PT2-V may surround the light-emitting regions PXA spaced in the second protrusion direction EDR2 of the second reflection pattern RP-H. Meanwhile, in the specification, the third sections PT1-V of the second line SML-V may be referred to as the first sections of the second line SML-V, and the fourth sections PT2-V of the second line SML-V may be referred to as the second sections of the second line SML-V.

Figure 12A:
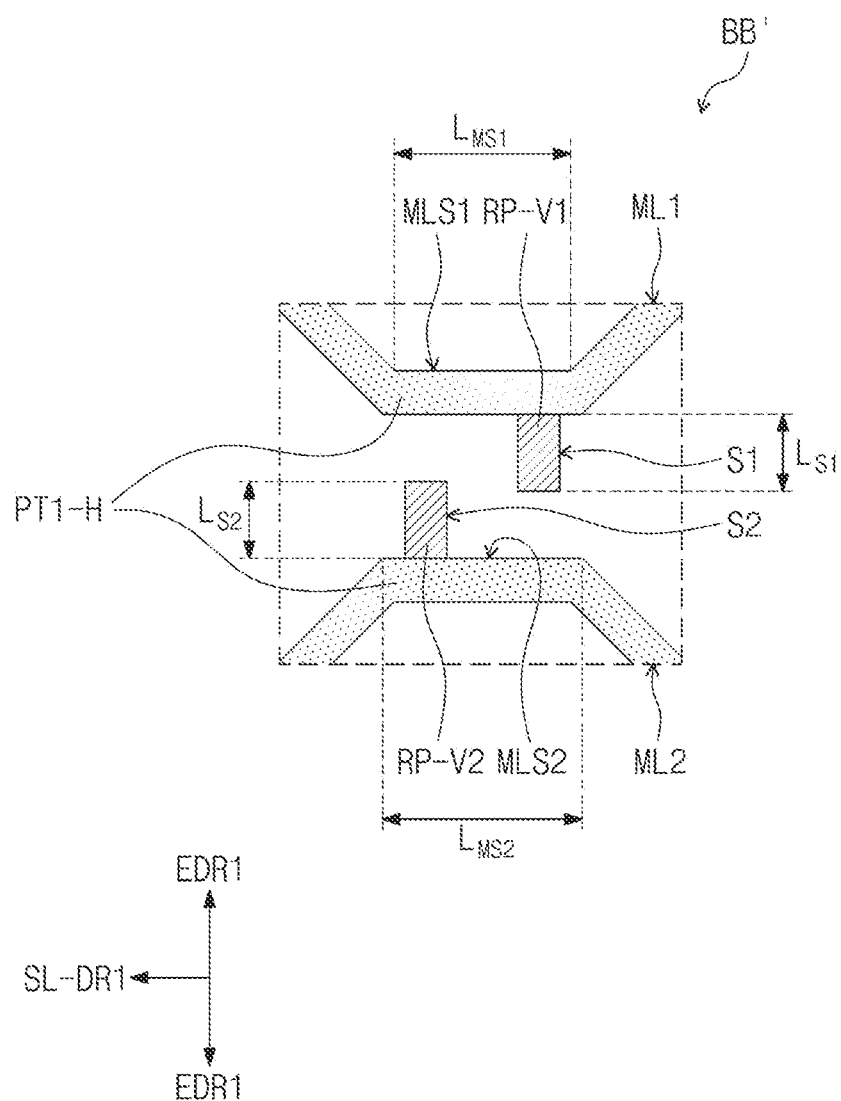
FIG. 12A is an enlarged plan view showing a portion of an input sensor.
Figure 12B:
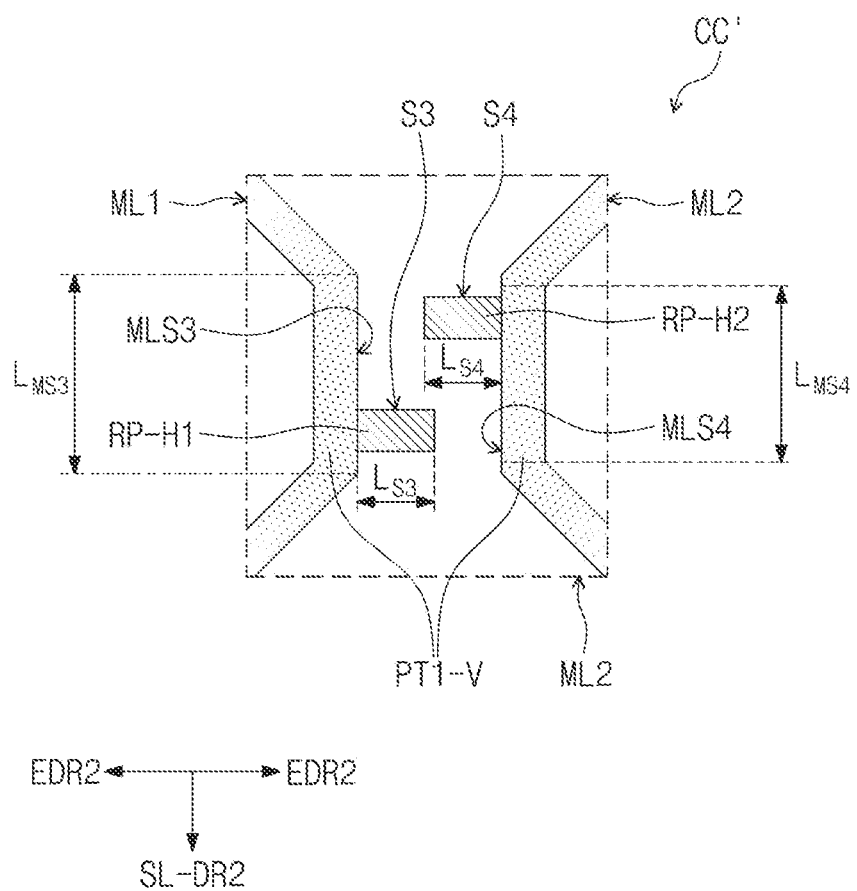
FIG. 12B is an enlarged plan view showing a portion of an input sensor.

Each of FIGS. 12A and 12B is an enlarged plan view showing a portion of an input sensor. FIG. 12A is an enlarged plan view showing a portion corresponding to BB' region of FIG. 10, and FIG. 12B is an enlarged plan view showing a portion corresponding to CC' region of FIG. 10.

FIG. 12A illustrates a portion of the first main line ML1 and the second main line ML2, and illustrates the first sub-reflection pattern RP-V1 and the second sub-reflection pattern RP-V2 that are located between the first main line ML1 and the second main line ML2. FIG. 12B illustrates the third sub-reflection pattern RP-H1 and the fourth sub-reflection pattern RP-H2, and a portion of the first main line ML1 and the second main line ML2.

Referring to FIGS. 12A and 12B, the sum $L_{S1}+L_{S2}$ of the lengths, in the first protrusion direction EDR1, of the sub-reflection patterns RP-V1 and RP-V2 arranged between the first main line ML1 and the second main line ML2 of a unit length may be equal to the sum $L_{MS3}+L_{MS4}$ of the lengths, in the second extension direction SL-DR2, of the third sections PT1-V of the first main line ML1 and the second main line ML2 of a unit length.

Also, the sum $L_{S3}+L_{S4}$ of the lengths, in the second protrusion direction EDR2, of the sub-reflection patterns RP-H1 and RP-H2 arranged between the first main line ML1 and the second main line ML2 of a unit length may be equal to the sum $L_{MS1}+L_{MS2}$ of the lengths, in the first extension direction SL-DR1, of the first sections PT1-H of the first main line ML1 and the second main line ML2 of a unit length.

That is, referring to FIGS. 12A and 12B, the sum $L_{S1}+L_{S2}$ of the length $L_{S1}$, in the first protrusion direction EDR1, of one side surface S1 of the first sub-reflection pattern RP-V1 adjacent to the first main line ML1 and the length $L_{S2}$, in the first protrusion direction EDR1, of one side surface S2 of the second sub-reflection pattern RP-V2 adjacent to the second main line ML2 may be substantially equal to the sum $L_{MS3}+L_{MS4}$ of the length $L_{MS3}$, in the second extension direction SL-DR2, of one side surface MLS3 of the third section PT1-V of the first main line ML1 and the length $L_{MS4}$, in the second extension direction SL-DR2, of one side surface MLS4 of the third section PT1-V of the second main line ML2.

Also, the sum $L_{S3}+L_{S4}$ of the length $L_{S3}$, in the second protrusion direction EDR2, of one side surface S3 of the third sub-reflection pattern RP-H1 adjacent to the first main line ML1, and the length $L_{S4}$, in the second protrusion direction EDR2, of one side surface S4 of the fourth sub-reflection pattern RP-H2 adjacent to the second main line ML2, may be substantially equal to the sum $L_{MS1}+L_{MS2}$ of the length $L_{MS1}$, in the first extension direction SL-DR1, of one side surface MLS1 of the first section PT1-H of the first main line ML1, and the length $L_{MS2}$, in the first extension direction SL-DR1, of one side surface MLS2 of the first section PT1-H of the second main line ML2.

Meanwhile, in FIGS. 12A and 12B, the length $L_{S1}$ on one side surface S1 of the first sub-reflection pattern RP-V1 may be equal to the length $L_{S2}$ on one side surface S2 of the second sub-reflection pattern RP-V2. However, the present disclosure is not limited thereto. In one or more embodiments, with respect to the length $L_{S1}$ on one side surface S1 of the first sub-reflection pattern RP-V1 and the length $L_{S2}$ on one side surface S2 of the second sub-reflection pattern RP-V2, a ratio of the length $L_{S1}$ on one side surface S1 of the first sub-reflection pattern RP-V1 to the length $L_{S2}$ on one side surface S2 of the second sub-reflection pattern RP-V2 may be adjusted diversely under the condition that the sum $L_{S1}+L_{S2}$ is substantially equal to the sum $L_{MS3}+L_{MS4}$ of both the length $L_{MS3}$, in the second extension direction SL-DR2, of one side surface MLS3 of the third section PT1-V of the first main line ML1, and the length $L_{MS4}$, in the second extension direction SL-DR2, of one side surface MLS4 of the third section PT1-V of the second main line ML2.

Also, in FIGS. 12A and 12B, the length $L_{S3}$ on one side surface S3 of the third sub-reflection pattern RP-H1 may be equal to the length $L_{S4}$ on one side surface S4 of the fourth sub-reflection pattern RP-H2. However, the present disclosure is not limited thereto. In one or more embodiments, with respect to the length $L_{S3}$ on one side surface S3 of the third sub-reflection pattern RP-H1, and with respect to the length $L_{S4}$ on one side surface S4 of the fourth sub-reflection pattern RP-H2, a ratio of the length $L_{S3}$ on one side surface S3 of the third sub-reflection pattern RP-H1 to the length $L_{S4}$ on one side surface S4 of the fourth sub-reflection pattern RP-H2, may be adjusted diversely under the condition that the sum $L_{S3}+L_{S4}$ is substantially equal to the sum $L_{MS1}+L_{MS2}$ of both of the length $L_{MS1}$, in the first extension direction SL-DR1, of one side surface MLS1 of the first section PT1-H of the first main line ML1, and the length $L_{MS2}$, in the first extension direction SL-DR1, of one side surface MLS2 of the first section PT1-H of the second main line ML2.

Figure 13:
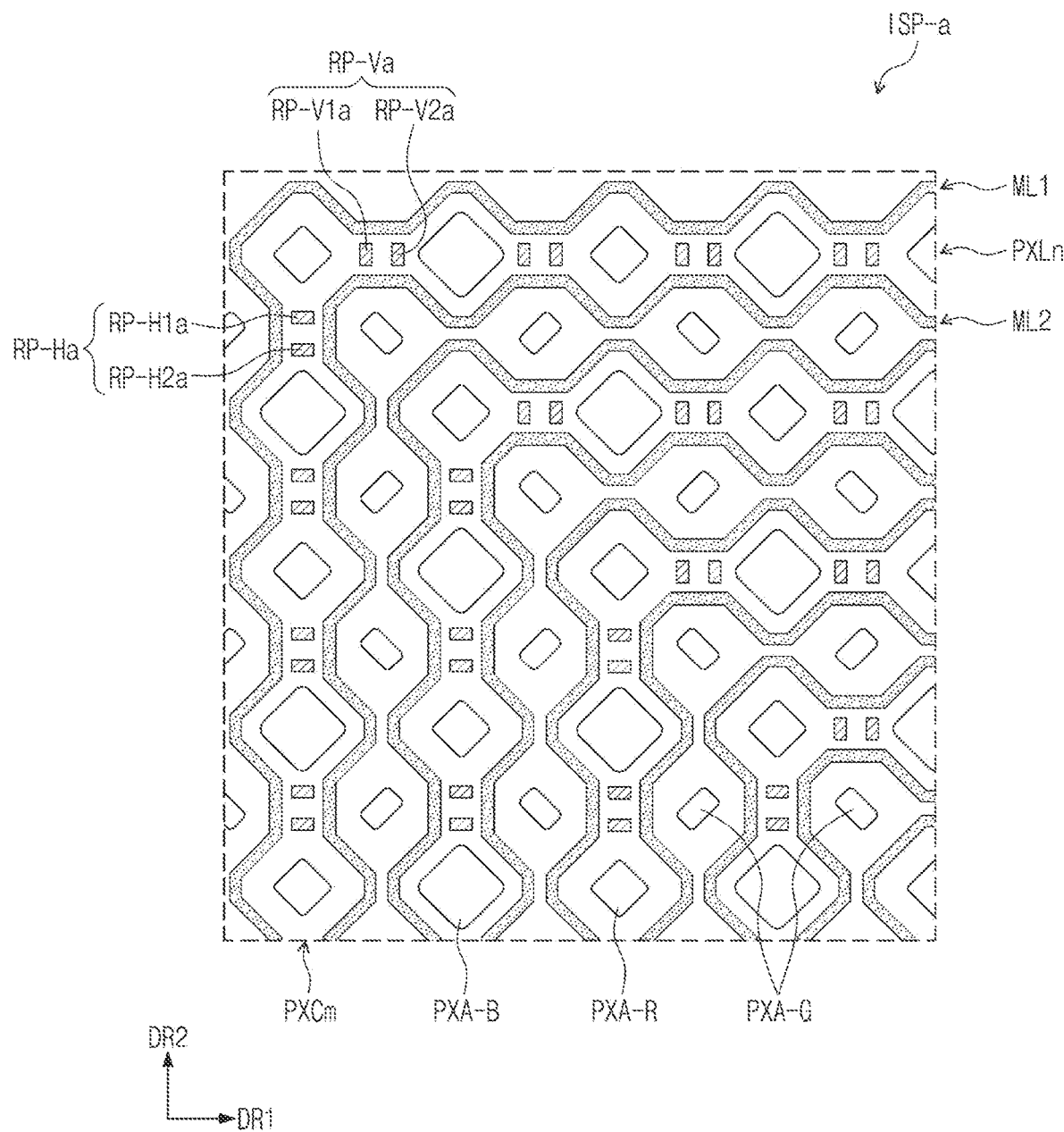
FIG. 13 is a plan view showing region YY' of FIG. 7.
Figure 14:
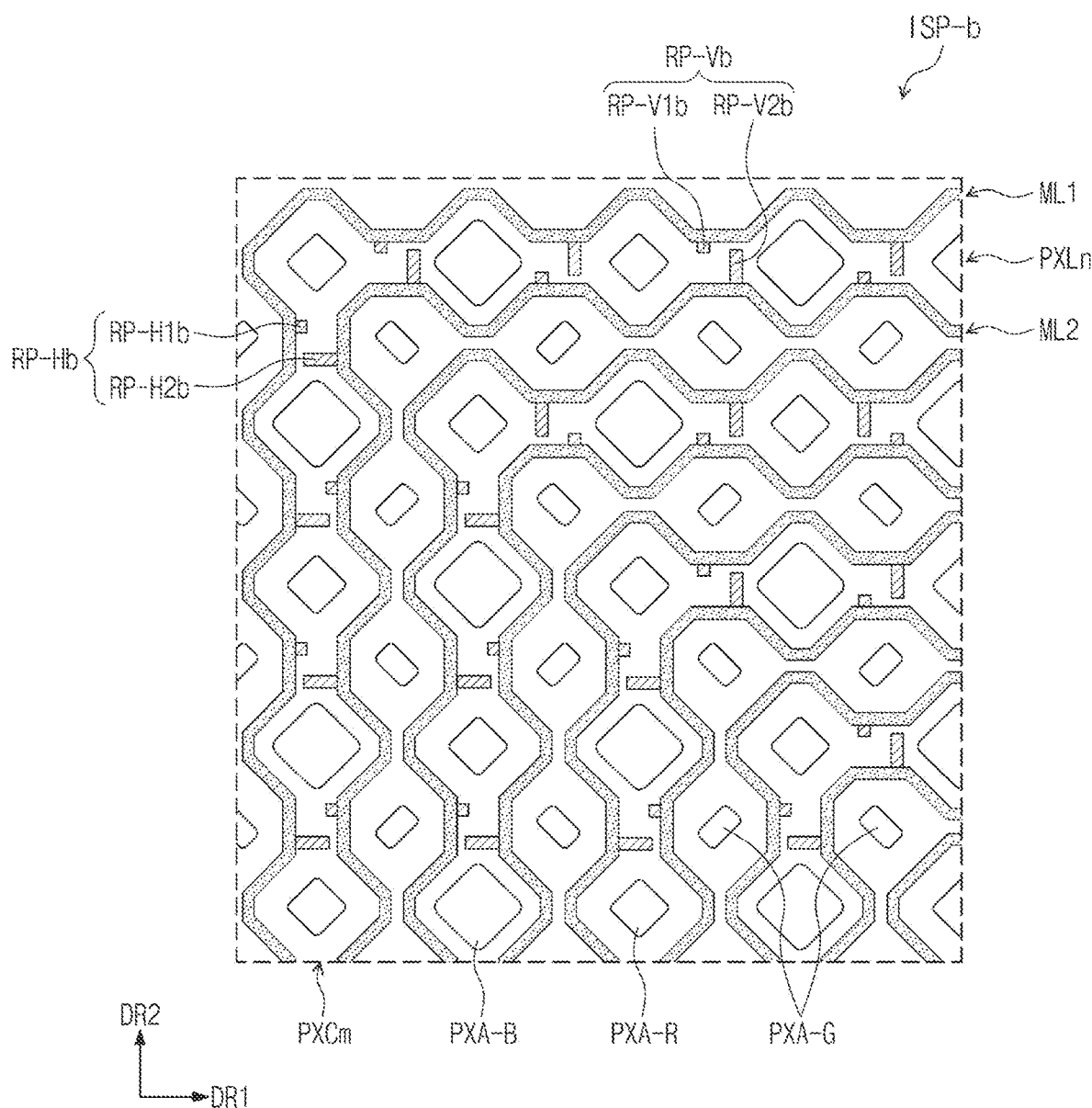
FIG. 14 is a plan view showing region YY' of FIG. 7.
Figure 15:
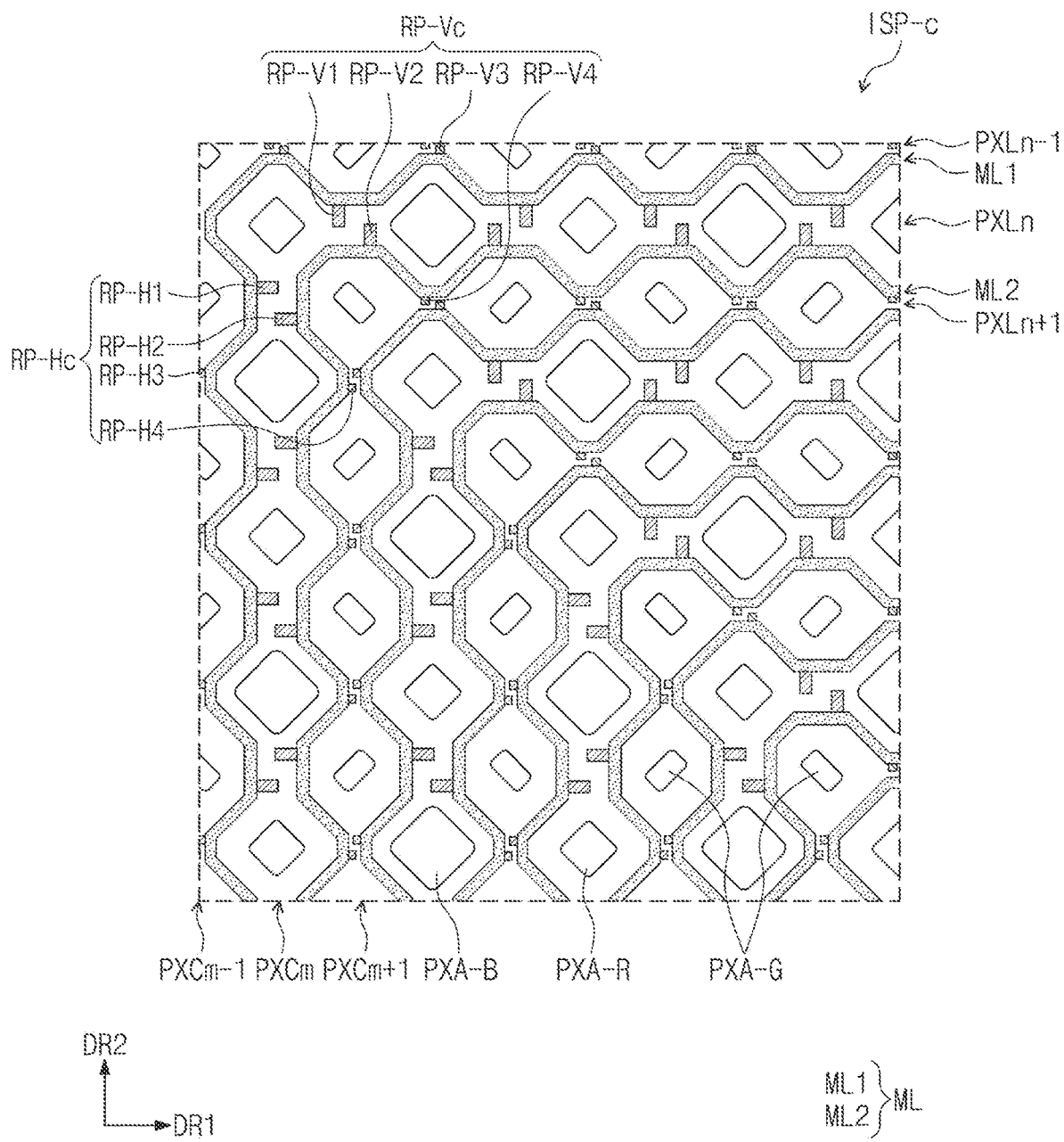
FIG. 15 is a plan view showing region YY' of FIG. 7.

Each of FIGS. 13 to 15 is a plan view showing a portion of an input sensor according to one or more embodiments. Each of FIGS. 13 to 15 is a plan view showing embodiments corresponding to region YY' of FIG. 7. When describing embodiments with reference to FIGS. 13 to 15, contents duplicated with those described with reference to FIGS. 1 to 12B are not described again, and their differences will be mainly described.

An input sensor ISP-a according to one or more embodiments illustrated in FIG. 13 is different from the embodiments corresponding to FIG. 9 in that the reflection patterns RP-Va are RP-Ha are spaced apart from main lines ML1 and ML2. The input sensor ISP-a according to one or more embodiments may include: the light-emitting regions PXA-B, PXA-R, and PXA-G arranged in the line region LA (FIG. 7); the first main line ML1 and the second main line ML2 that are arranged adjacent to each other with the light-emitting regions PXA-B, PXA-R, and PXA-G therebetween; and a first reflection pattern RP-Va and a second reflection pattern RP-Ha.

The first main line ML1 and the second main line ML2 may be arranged adjacent to each other with, for example, the n-th light-emitting row PXLn and the m-th light-emitting column PXCm therebetween. The first reflection pattern RP-Va may be located between the light-emitting regions PXA-B, PXA-R, and PXA-G that are adjacent to each other at the n-th light-emitting row PXLn. The second reflection pattern RP-Ha may be located between the light-emitting regions PXA-B, PXA-R, and PXA-G that are adjacent to each other at the m-th light-emitting column PXCm.

The first reflection pattern RP-Va may include a first sub-reflection pattern RP-V1a and a second sub-reflection pattern RP-V2a that are spaced apart from each other in the first direction DR1. The second reflection pattern RP-Ha may include a third sub-reflection pattern RP-H1a and a fourth sub-reflection pattern RP-H2a that are spaced apart from each other in the second direction DR2. The lengths of the first sub-reflection pattern RP-V1a and the second sub-reflection pattern RP-V2a in the second direction DR2 may be equal to or different from each other. Also, the lengths of the third sub-reflection pattern RP-H1a and the fourth sub-reflection pattern RP-H2a in the first direction DR1 may be equal to or different from each other.

The sum of the lengths, in the second direction DR2, of the first sub-reflection pattern RP-V1a and the second sub-reflection pattern RP-V2a may be substantially equal to the sum of the lengths of corresponding sections, that are parallel to the second direction DR2, of the first main line ML1 and the second main line ML2 and that are adjacent to the third sub-reflection pattern RP-H1a and the fourth sub-reflection pattern RP-H2a. Also, the sum of the lengths, in the first direction DR1, of the third sub-reflection pattern RP-H1a and the fourth sub-reflection pattern RP-H2a may be substantially equal to the sum of the lengths of sections, that are parallel to the first direction DR1, of the first main line ML1 and the second main line ML2 that are adjacent to the first sub-reflection pattern RP-V1a and the second sub-reflection pattern RP-V2a. Accordingly, the difference in reflection amounts of the light incident according to the extension direction of the main lines ML1 and ML2 is reduced, and thus the visibility of the sensing line due to the reflected light may be reduced. Therefore, display quality of the electronic device according to one or more embodiments may be improved.

An input sensor ISP-b according to one or more embodiments illustrated in FIG. 14 may include: the light-emitting regions PXA-B, PXA-R, and PXA-G arranged in the line region LA (FIG. 7); the first main line ML1 and the second main line ML2 that are arranged adjacent to each other with the light-emitting regions PXA-B, PXA-R, and PXA-G therebetween; and a first reflection pattern RP-Vb and a second reflection pattern RP-Hb.

The first main line ML1 and the second main line ML2 may be arranged adjacent to each other with the n-th light-emitting row PXLn and the m-th light-emitting column PXCm therebetween. The first reflection pattern RP-Vb may be located between the light-emitting regions PXA-B, PXA-R, and PXA-G that are adjacent to each other at the n-th light-emitting row PXLn. The second reflection pattern RP-Hb may be located between the light-emitting regions PXA-B, PXA-R, and PXA-G that are adjacent to each other at the m-th light-emitting column PXCm.

The first reflection pattern RP-Vb may include a first sub-reflection pattern RP-V1b and a second sub-reflection pattern RP-V2b that are spaced apart from each other in the first direction DR1. The second reflection pattern RP-Hb may include a third sub-reflection pattern RP-H1b and a fourth sub-reflection pattern RP-H2b that are spaced apart from each other in the second direction DR2.

The sum of the lengths, in the second direction DR2, of the first sub-reflection pattern RP-V1b and the second sub-reflection pattern RP-V2b may be substantially equal to the sum of the lengths of sections, parallel to the second direction DR2, of the first main line ML1 and the second main line ML2 that are adjacent to the third sub-reflection pattern RP-H1b and the fourth sub-reflection pattern RP-H2b. Also, the sum of the lengths, in the first direction DR1, of the third sub-reflection pattern RP-H1b and the fourth sub-reflection pattern RP-H2b may be substantially equal to the sum of the lengths of sections, parallel to the first direction DR1, of the first main line ML1 and the second main line ML2 that are adjacent to the first sub-reflection pattern RP-V1b and the second sub-reflection pattern RP-V2b. Accordingly, the difference in reflection amounts of the light incident according to the extension direction of the main lines ML1 and ML2 is reduced, and thus the visibility of the sensing line due to the reflected light may be reduced. Therefore, display quality of the electronic device according to one or more embodiments may be improved.

An input sensor ISP-c according to one or more embodiments illustrated in FIG. 15 is different from the embodiments corresponding to FIG. 9 in that the number of the reflection patterns RP-Vc and RP-Hc increases.

The input sensor ISP-c according to one or more embodiments may include: the light-emitting regions PXA-B, PXA-R, and PXA-G arranged in the line region LA (FIG. 7); the first main line ML1 and the second main line ML2 that are arranged adjacent to each other with the light-emitting regions PXA-B, PXA-R, and PXA-G therebetween; and a first reflection pattern RP-Vc and a second reflection pattern RP-Hc.

The first main line ML1 and the second main line ML2 may be arranged adjacent to each other with the n-th light-emitting row PXLn and the m-th light-emitting column PXCm therebetween.

The first reflection pattern RP-Vc may include a first sub-reflection pattern RP-V1, a second sub-reflection pattern RP-V2, a fifth sub-reflection pattern RP-V3, and a sixth sub-reflection pattern RP-V4.

The first sub-reflection pattern RP-V1 and the fifth sub-reflection pattern RP-V3 may protrude from the first main line ML1, but protrusion directions thereof may be different from each other. That is, the first reflection pattern RP-Vc may include sub-reflection patterns that respectively protrude toward an n-th light-emitting row PXLn and an (n−1)th light-emitting row PXLn−1 that are arranged with the first main line ML1 therebetween.

The second sub-reflection pattern RP-V2 and the sixth sub-reflection pattern RP-V4 may protrude from the second main line ML2, but protrusion directions thereof may be different from each other. That is, the first reflection pattern RP-Vc may include sub-reflection patterns that respectively protrude toward an n-th light-emitting row PXLn and an (n+1)th light-emitting row PXLn+1 that are arranged with the second main line ML2 therebetween.

The second reflection pattern RP-Hc may include a third sub-reflection pattern RP-H1, a fourth sub-reflection pattern RP-H2, a seventh sub-reflection pattern RP-H3, and an eighth sub-reflection pattern RP-H4.

The third sub-reflection pattern RP-H1 and the seventh sub-reflection pattern RP-H3 may protrude from the first main line ML1, but protrusion directions thereof may be different from each other. That is, the second reflection pattern RP-Hc may include sub-reflection patterns that respectively protrude toward an m-th light-emitting column PXCm and an (m−1)th light-emitting column PXCm−1 that are arranged with the first main line ML1 therebetween.

The fourth sub-reflection pattern RP-H2 and the eighth sub-reflection pattern RP-H4 may protrude from the second main line ML2, but protrusion directions thereof may be different from each other. That is, the second reflection pattern RP-Hc may include sub-reflection patterns that respectively protrude toward an m-th light-emitting column PXCm and an (m+1)th light-emitting column PXCm+1 that are arranged with the second main line ML2 therebetween.

The sum of the lengths, in the second direction DR2, of the first sub-reflection pattern RP-V1, the second sub-reflection pattern RP-V2, the fifth sub-reflection pattern RP-V3, and the sixth sub-reflection pattern RP-V4 may be substantially equal to the sum of the lengths of sections, parallel to the second direction DR2, of the first main line ML1 and the second main line ML2 that are adjacent to the second reflection pattern RP-Hc. Also, the sum of the lengths, in the first direction DR1, of the third sub-reflection pattern RP-H1, the fourth sub-reflection pattern RP-H2, the seventh sub-reflection pattern RP-H3, and the eighth sub-reflection pattern RP-H4 may be substantially equal to the sum of the lengths of sections, parallel to the first direction DR1, of the first main line ML1 and the second main line ML2 that are adjacent to the first reflection pattern RP-Vc. Accordingly, the difference in reflection amounts of the light incident according to the extension direction of the main lines ML1 and ML2 is reduced, and thus the visibility of the sensing line due to the reflected light may be reduced. Therefore, display quality of the electronic device according to one or more embodiments may be improved.

Figure 16:
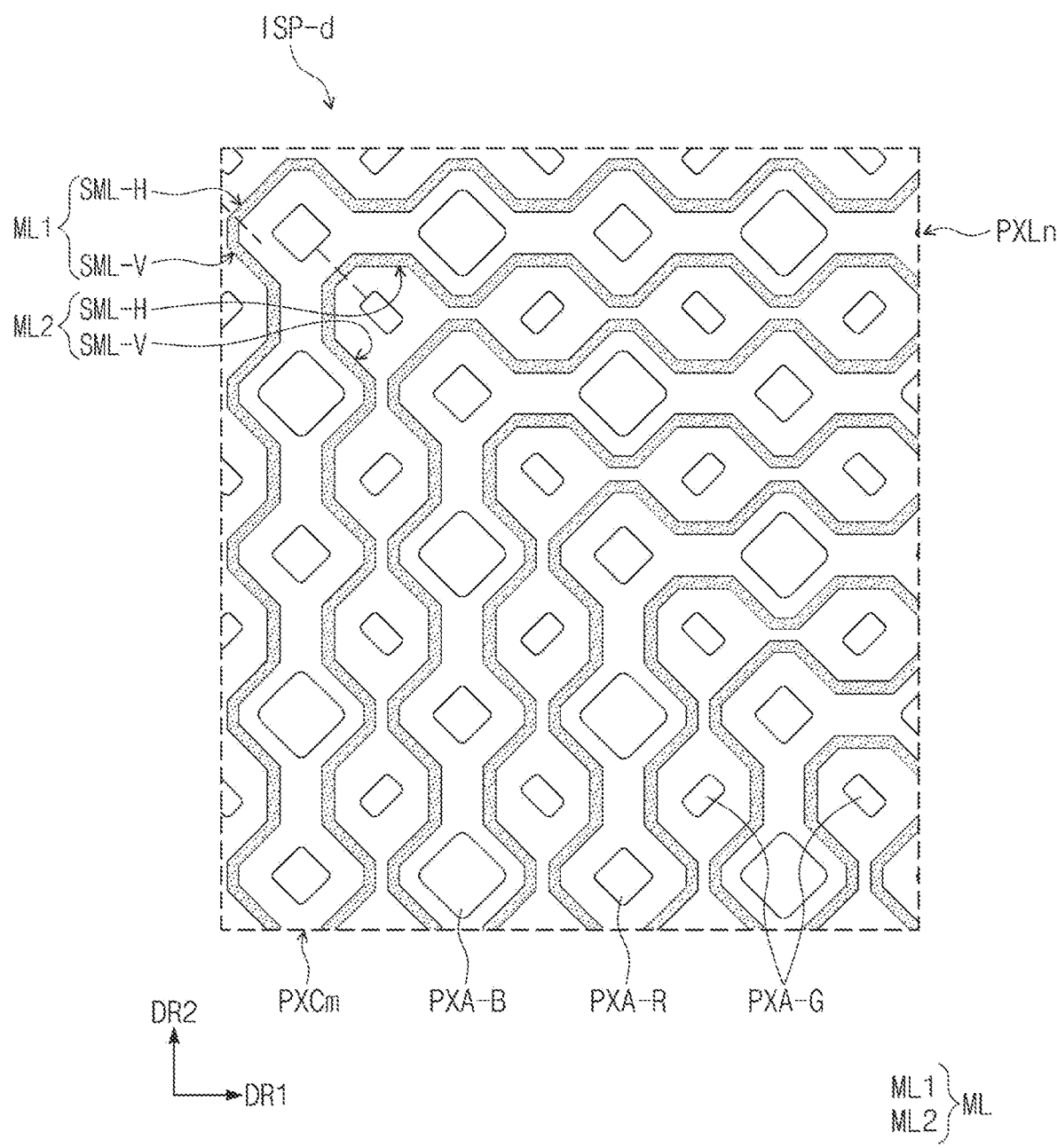
FIG. 16 is a plan view showing region YY' of FIG. 7.

FIG. 16 is a plan view showing a portion of an input sensor according to one or more embodiments. FIG. 16 may be an enlarged view showing one or more embodiments corresponding to region YY' of FIG. 7. When describing one or more embodiments with reference to FIG. 16, contents duplicated with those described with reference to FIGS. 1 to 12B are not described again, and their differences will be mainly described.

Referring to FIG. 16, an input sensor ISP-d according to one or more embodiments is different from the embodiments corresponding to FIG. 9 in that the reflection patterns RP-V and RP-H (FIG. 9) are omitted. The input sensor ISP-d according to one or more embodiments may include: the light-emitting regions PXA-B, PXA-R, and PXA-G arranged in the line region LA (FIG. 7); and the first main line ML1 and the second main line ML2 that are arranged adjacent to each other with the light-emitting regions PXA-B, PXA-R, and PXA-G therebetween. The first main line ML1 and the second main line ML2 may be arranged along the shape of the light-emitting regions PXA-B, PXA-R, and PXA-G in the outside of the light-emitting regions PXA-B, PXA-R, and PXA-G so as not to overlap the light-emitting regions PXA-B, PXA-R, and PXA-G. Each of the main lines ML1 and ML2 in the line region LA (FIG. 7) may include a first line SML-H and a second line SML-V that extend in different directions.

That is, in one or more embodiments, the main lines ML1 and ML2 are bent so as to include the lines SML-H and SML-V that extend in different directions, and thus the area of the line region LA (FIG. 7) may be reduced or minimized. Thus, in the input sensor ISP according to one or more embodiments, the arrangement of the main lines ML1 and ML2 is improved or optimized in the line region LA (FIG. 7), and thus the area of non-sensing regions that are not sensed may be reduced.

In FIG. 16, the first line SML-H is illustrated as being parallel to the first direction DR1, and the second line SML-V is illustrated as being parallel to the second direction DR2. However, the present disclosure is not limited thereto.

Meanwhile, the descriptions of the input sensors according to one or more embodiments described with reference to FIGS. 9 and 13 to 16 may also be applied in the same manner to the sensing lines SL (FIG. 7) arranged in the sensing region SA (FIG. 7). Referring to FIG. 7 again, the sensing lines SL, which are arranged in the sensing region SA and connected to the sensing electrodes SP, and which extend toward the line region LA, are illustrated as straight lines substantially parallel to the second direction DR2 or the first direction DR1. However, the sensing lines SL arranged in the sensing region SA may extend while being deformed to have a curved shape so as not to overlap the light-emitting regions.

Figure 17A:
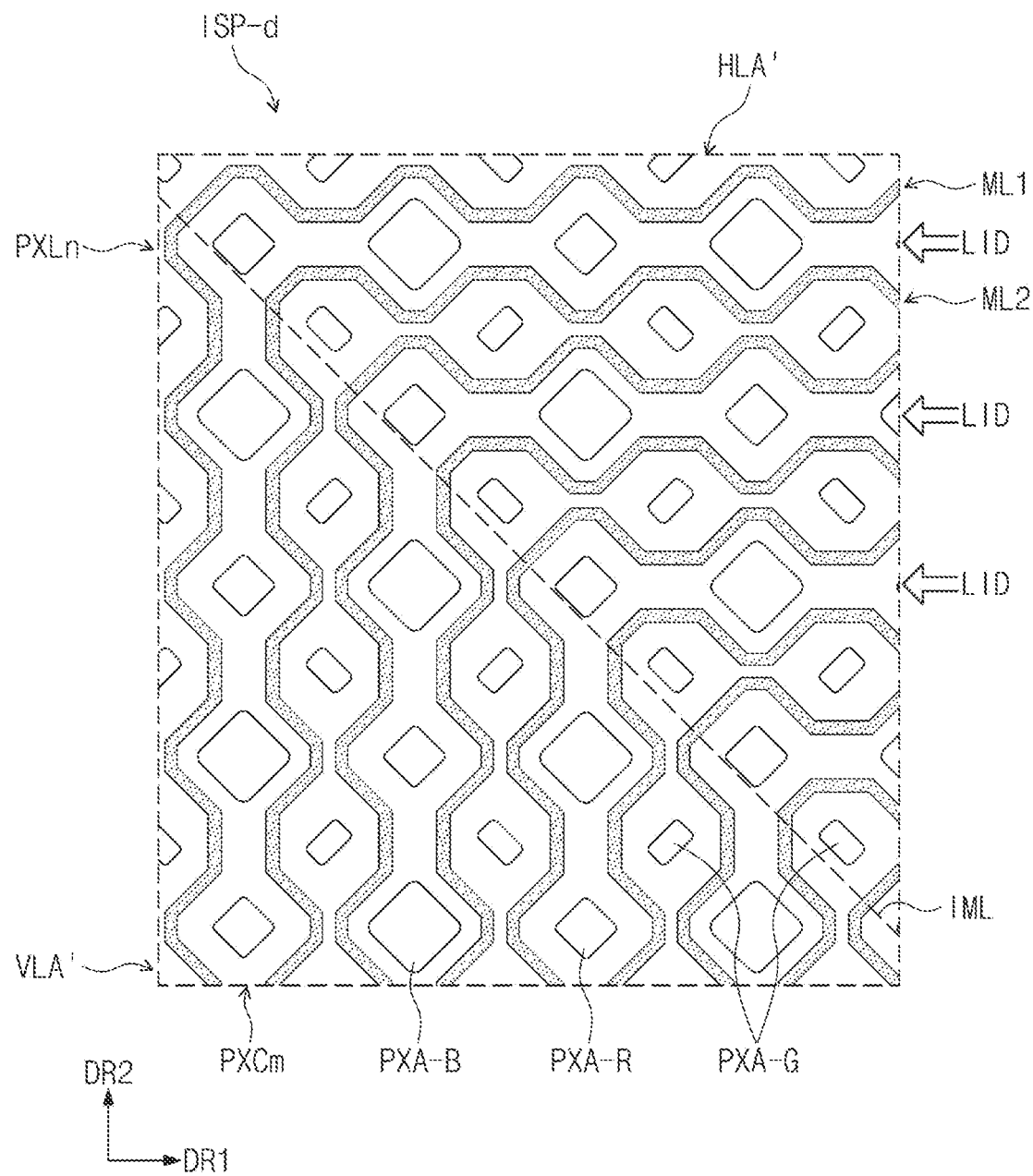
FIG. 17A is a plan view showing arrangement of sensing lines according to one or more embodiments.
Figure 17B:
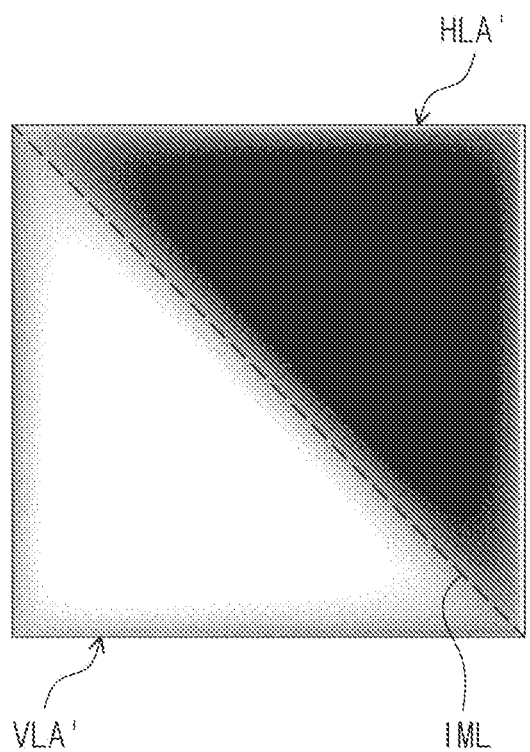
FIG. 17B is an image for evaluating visibility in the arrangement of the sensing lines of FIG. 17A.

FIG. 17A is a plan view showing an example in which light is incident in the input sensor according to one or more embodiments that does not have the reflection pattern as illustrated in FIG. 16. FIG. 17B is an image for evaluating visibility in the arrangement of the sensing lines of FIG. 17A. FIG. 17A may be a view corresponding to a region YY' of FIG. 7.

The input sensor ISP-d may include the first main line ML1 and the second main line ML2 that are adjacent to each other with the n-th light-emitting row PXLn and the m-th light-emitting column PXCm therebetween, and may not include a reflection pattern. In FIG. 17A, a virtual reference the line IML may represent portions in which the extension directions of the first main line ML1 and the second main line ML2 are changed. Accordingly, when an incident direction LID of incident light is substantially parallel to the first direction DR1, a light reflection amount in a portion HLA' (hereinafter, referred to as a black region), in which the main lines ML1 and ML2 extend in a direction parallel to the first direction DR1, is small, and thus a dark portion may appear as in an image shown in FIG. 17B.

Also, when an incident direction LID of incident light is substantially parallel to the first direction DR1, a light reflection amount in a portion VLA' (hereinafter, referred to as a white region), in which the main lines ML1 and ML2 extend in a direction substantially parallel to the second direction DR2, is large, and thus a bright portion may appear as in an image shown in FIG. 17B.

Figure 18A:
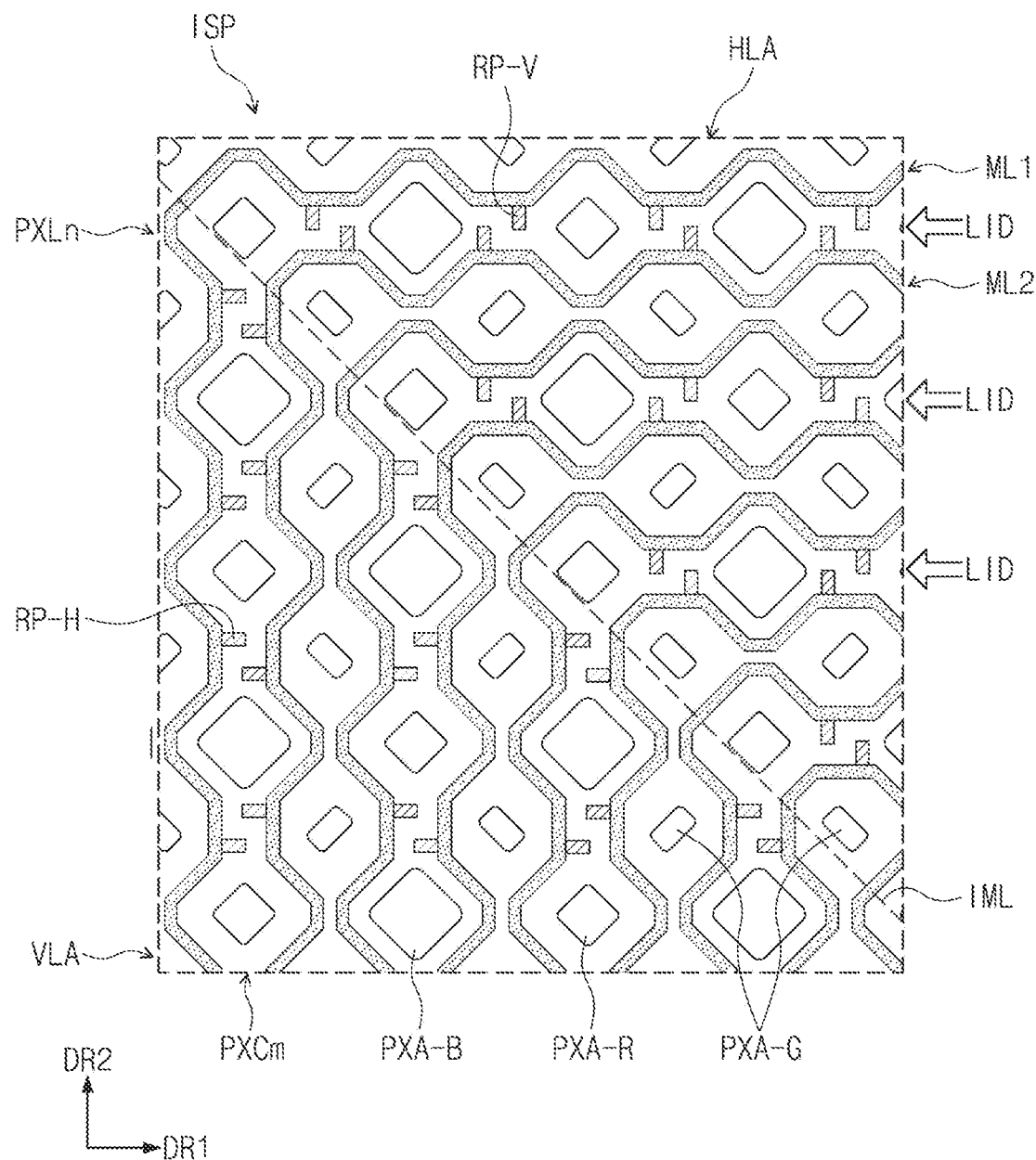
FIG. 18A is a plan view showing arrangement of sensing lines according to one or more embodiments.
Figure 18B:
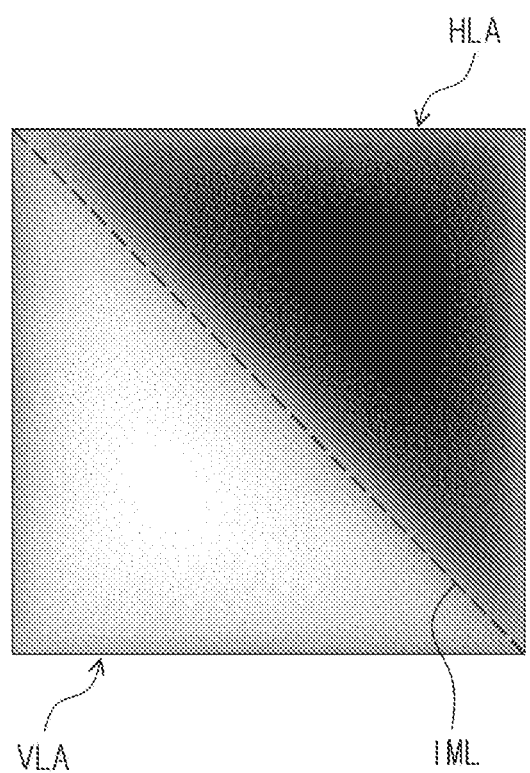
FIG. 18B is an image for evaluating visibility in the arrangement of the sensing lines of FIG. 18A.

FIG. 18A is a plan view showing an example in which light is incident in the input sensor according to one or more embodiments that include the reflection pattern as illustrated in FIG. 9. FIG. 18B is an image for evaluating visibility in the arrangement of the sensing lines of FIG. 18A. The input sensor ISP may include: the first main line ML1 and the second main line ML2 that are adjacent to each other with the n-th light-emitting row PXLn and the m-th light-emitting column PXCm therebetween; and the reflection patterns RP-V and RP-H that are arranged between the first main line ML1 and the second main line ML2. In FIG. 18A, a virtual reference the line IML may represent portions in which the extension directions of the first main line ML1 and the second main line ML2 are changed.

One or more embodiments further include the reflection patterns RP-V and RP-H. Thus, a difference between a light reflection amount in a portion HLA (hereinafter, referred to as a black region), in which the main lines ML1 and ML2 extend in a direction substantially parallel to the first direction DR1 that is an incident direction LID of the incident light, and a light reflection amount in a portion VLA (hereinafter, referred to as a white region), in which the main lines ML1 and ML2 extend in a direction substantially parallel to the second direction DR2, may become smaller than the input sensor ISP-d illustrated in FIG. 17A.

When assuming that the difference in brightness between the black region HLA' and the white region VLA' in the input sensor ISP-d illustrated in FIG. 17B is about 100%, the difference in brightness between the black region HLA and the white region VLA in the input sensor ISP illustrated in FIG. 18B may be reduced to about 62.4%. That is, it can be seen that some embodiments, which further include the reflection patterns arranged between the main lines, exhibit excellent display quality by reducing visibility of the sensing line due to inflow of the reflected light, when compared to the embodiments that do not include the reflection pattern.

Figure 19A:
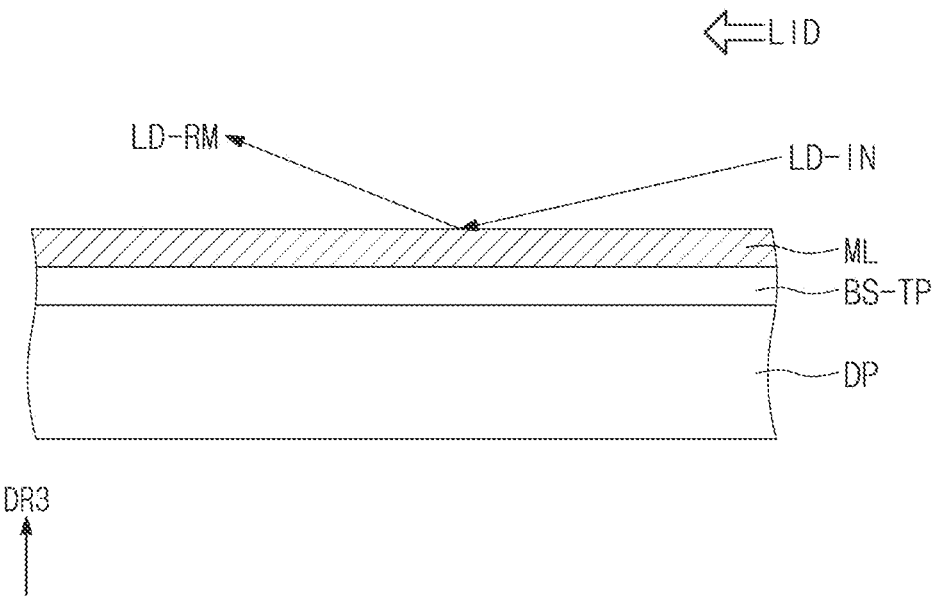
FIG. 19A is a view illustratively showing a traveling direction of reflected light in a main line.
Figure 19B:
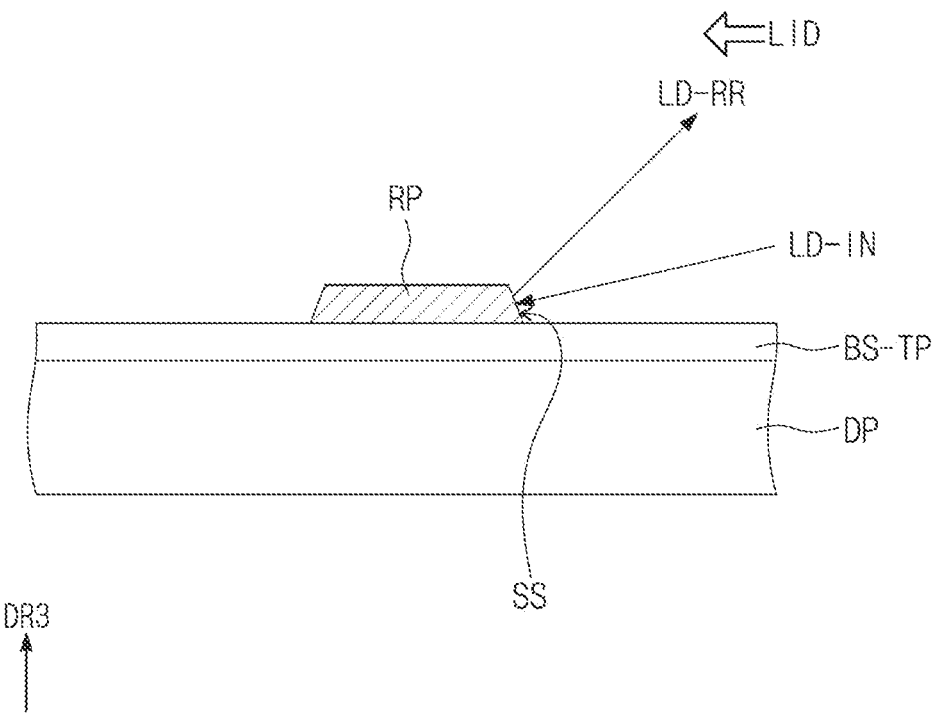
FIG. 19B is a view illustratively showing a traveling direction of reflected light in a reflection pattern.

FIG. 19A is a view illustratively showing a traveling direction of reflected light in a main line. FIG. 19B is a view illustratively showing a traveling direction of reflected light in a reflection pattern. FIG. 19A illustrates a display panel DP, a sensing base layer BS-TP located on the display panel DP, and a main line ML located on the sensing base layer BS-TP. FIG. 19B illustrates a display panel DP, a sensing base layer BS-TP located on the display panel DP, and a reflection pattern RP located on the sensing base layer BS-TP.

For light LD-IN incident from the outside, a direction LD-RM in which the light is reflected from the main line ML, and a direction LD-RR in which the light is reflected from the reflection pattern RP, may be different from each other. The reflection pattern RP may include an inclined side surface SS when viewed in the cross-sectional view perpendicular to the upper surface of the display panel DP. The direction LD-RR of the reflected light with respect to the light that is incident to the reflection pattern RP may be changed toward the direction of the light LD-IN that is incident from the outside because of the inclined side surface SS of the reflection pattern RP. Thus, the reflection of external light may increase in a portion in which the reflection pattern RP is located. Accordingly, the direction LD-RM of the reflected light that is reflected from the main line ML extending in a direction substantially parallel to the incident direction LID of external light becomes opposite to the incident direction LID, and thus, it is possible to compensate a portion in which the reflection of the external light is reduced.

That is, in one or more embodiments that include the reflection pattern RP having the inclined side surface to compensate a portion in which the light reflection amount in the main line ML is reduced, it is possible to reduce the visibility of the main line ML according to the incident direction of the reflected light.

The electronic device according to one or more embodiments includes the sensing lines that are bent to surround the light-emitting regions so as not to overlap the light-emitting regions in the line region that is a non-sensing region. Thus, the area of the non-sensing region may be reduced or minimized, and a dead space may be reduced.

Also, the electronic device according to one or more embodiments includes sensing lines arranged in the active region and the reflection patterns arranged between the sensing lines. Thus, the visibility of the sensing lines due to the reflected light may be reduced to achieve excellent display quality.

The electronic device according to one or more embodiments includes the reflection patterns that are located between the sensing lines arranged on the active region, and may reduce or prevent visual recognition of sensing lines due to the reflected light.

The electronic device according to one or more embodiments may include the reflection patterns arranged between the sensing lines and may exhibit excellent display quality.

Although the present disclosure has been described with reference to the embodiments described above, it will be understood that various changes and modifications of the present disclosure may be made by one ordinary skilled in the art or one having ordinary knowledge in the art without departing from the spirit and technical field of the disclosure as hereinafter claimed. Accordingly, the technical scope of the disclosure should not be limited by the foregoing description, but rather should be defined only by the following claims, with functional equivalents thereof to be included therein.

What is claimed is:

1. An electronic device comprising:
    a display panel comprising an active region, and a peripheral region at one side of the active region; and
    an input sensor comprising a sensing region above the active region, a sensing peripheral region above the peripheral region, and a line region above the active region and between the sensing region and the sensing peripheral region,
    wherein the input sensor comprises:
        sensing electrodes arranged in the sensing region;
        main lines arranged in the line region, and connected to the sensing electrodes; and
        reflection patterns arranged in the line region between the main lines.

2. The electronic device of claim 1, wherein the display panel comprises light-emitting regions arranged in the active region, and
    wherein the main lines do not overlap the light-emitting regions, the main lines comprising:
        a first line extending in a first extension direction; and
        a second line connected to the first line, and extending in a second extension direction that is different from the first extension direction.

3. The electronic device of claim 2, wherein the reflection patterns do not overlap the light-emitting regions, and comprise:
    a first reflection pattern extending in a first protrusion direction substantially parallel to the second extension direction; and
    a second reflection pattern extending in a second protrusion direction substantially parallel to the first extension direction.

4. The electronic device of claim 3, wherein the first reflection pattern is connected to the first line, and
    wherein the second reflection pattern is connected to the second line.

5. The electronic device of claim 3, wherein the light-emitting regions define:
    light-emitting rows extending in a first direction substantially parallel to the first extension direction, and arranged in a second direction substantially perpendicular to the first direction; and
    light-emitting columns extending in the second direction, and arranged in the first direction.

6. The electronic device of claim 5, wherein the main lines comprise a first main line and a second main line that are adjacent to each other with an n-th light-emitting row among the light-emitting rows and an m-th light-emitting column therebetween,
    wherein the first reflection pattern is between ones of the light-emitting regions that are adjacent to each other in the first direction in the n-th light-emitting row,
    wherein the second reflection pattern is between others of the light-emitting regions that are adjacent to each other in the second direction in the m-th light-emitting column, and
    wherein each of n and m is an integer of one or more.

7. The electronic device of claim 6, wherein the first reflection pattern comprises sub-reflection patterns spaced apart from each other in the first extension direction.

8. The electronic device of claim 7, wherein at least one of the sub-reflection patterns is spaced apart from the main lines.

9. The electronic device of claim 7, wherein the first line of each of the first main line and the second main line comprises:

first sections substantially parallel to the first extension direction, and arranged between the ones of the light-emitting regions in the n-th light-emitting row; and second sections arranged between the first sections, and at least partially surrounding each of the ones of the light-emitting regions, and wherein the second line of each of the first main line and the second main line comprises:

third sections substantially parallel to the second extension direction, and arranged between the others of the light-emitting regions in the m-th light-emitting column; and fourth sections arranged between the third sections, and at least partially surrounding each of the others of the light-emitting regions.

10. The electronic device of claim 9, wherein a sum of lengths of the sub-reflection patterns between the first main line and the second main line of a unit length in the first protrusion direction is equal to a sum of lengths of the third sections of the first main line and the second main line of a unit length in the second extension direction.

11. The electronic device of claim 10, wherein the first reflection pattern comprises a first sub-reflection pattern connected to each of the first sections of the first main line, and a second sub-reflection pattern connected to each of the first sections of the second main line.

12. The electronic device of claim 11, wherein a length of the first sub-reflection pattern in the first protrusion direction is different from a length of the second sub-reflection pattern in the first protrusion direction.

13. The electronic device of claim 9, wherein a sum of lengths of the sub-reflection patterns arranged between the first main line and the second main line in the second protrusion direction is equal to a sum of lengths of the first sections of the first main line and the second main line in the first extension direction.

14. The electronic device of claim 13, wherein the second reflection pattern comprises a third sub-reflection pattern connected to each of the third sections of the first main line, and a fourth sub-reflection pattern connected to each of the third sections of the second main line.

15. The electronic device of claim 6, wherein the first reflection pattern comprises a first sub-reflection pattern connected to the first main line thereof, and a second sub-reflection pattern connected to the second main line thereof.

16. The electronic device of claim 6, wherein the second reflection pattern comprises sub-reflection patterns spaced apart from each other in the second extension direction.

17. The electronic device of claim 6, wherein the second reflection pattern comprises a third sub-reflection pattern connected to the first main line thereof, and a fourth sub-reflection pattern connected to the second main line thereof.

18. The electronic device of claim 1, wherein each of the reflection patterns has an inclined side surface when viewed in a cross-sectional view that is substantially perpendicular to upper surface of the display panel.

19. An electronic device comprising:
a display panel comprising an active region, in which light-emitting regions are arranged, and a peripheral region around the active region; and an input sensor above the display panel, and comprising sensing electrodes, sensing lines respectively connected to the sensing electrodes, and reflection patterns respectively between adjacent ones of the sensing lines, wherein each of the sensing lines comprises a peripheral line above the peripheral region, and a main line above the active region, wherein the main line does not overlap the light-emitting regions, and wherein each of the reflection patterns extends in a direction substantially perpendicular to an extension direction of the main line adjacent thereto.

20. The electronic device of claim 19, wherein the main line comprises a first line extending in a first extension direction, and a second line connected to the first line and extending in a second extension direction that is different from the first extension direction.

21. The electronic device of claim 20, wherein each of the sensing electrodes comprises a sensing pattern that has a mesh shape and does not overlap the light-emitting regions, wherein the main line has a shape corresponding to the mesh shape, and wherein each of the first line and the second line comprises first sections arranged between the light-emitting regions and substantially parallel to the extension direction, and second sections connected to the first sections and at least partially surrounding each of the light-emitting regions.

22. The electronic device of claim 21, wherein the reflection patterns do not overlap the light-emitting regions, and comprise:

first reflection patterns extending in a first protrusion direction substantially parallel to the second extension direction; and second reflection patterns extending in a second protrusion direction substantially parallel to the first extension direction.

23. The electronic device of claim 22, wherein the first reflection patterns are adjacent to the first sections of the first line, respectively, and wherein a sum of lengths of surfaces at one side of the first reflection patterns in the first protrusion direction is equal to a sum of lengths of surfaces at one side of the first sections of the second line in the first protrusion direction.

24. The electronic device of claim 22, wherein the second reflection patterns are adjacent to the first sections of the second line, respectively, and wherein a sum of lengths of surfaces at one side of the second reflection patterns in the second protrusion direction is equal to a sum of lengths of surfaces at one side of the first sections of the first line in the second protrusion direction.

* * * * *